United States Patent
Sim et al.

(10) Patent No.: US 9,378,979 B2
(45) Date of Patent: *Jun. 28, 2016

(54) METHODS OF FABRICATING SEMICONDUCTOR DEVICES AND DEVICES FABRICATED THEREBY

(71) Applicant: Samsung Electronics Co., Ltd., Suwon-si, Gyeonggi-do (KR)

(72) Inventors: Jae-Hwang Sim, Hwaseong-si (KR); Jinhyun Shin, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/503,498

(22) Filed: Oct. 1, 2014

(65) Prior Publication Data

US 2015/0054176 A1  Feb. 26, 2015

Related U.S. Application Data

(63) Continuation-in-part of application No. 14/079,282, filed on Nov. 13, 2013, now Pat. No. 8,969,215.

(30) Foreign Application Priority Data

Nov. 20, 2012 (KR) .................. 10-2012-0131829

(51) Int. Cl.
  *H01L 21/302* (2006.01)
  *H01L 21/3213* (2006.01)
  *H01L 21/033* (2006.01)
  *H01L 21/311* (2006.01)
  *H01L 27/115* (2006.01)

(52) U.S. Cl.
  CPC ...... *H01L 21/32139* (2013.01); *H01L 21/0337* (2013.01); *H01L 21/0338* (2013.01); *H01L 21/31144* (2013.01); *H01L 27/11519* (2013.01); *H01L 27/11531* (2013.01)

(58) Field of Classification Search
  CPC ............ H01L 21/3065; H01L 21/31144; H01L 21/32139; H01L 21/76895; H01L 21/3081; H01L 21/0338; H01L 21/0337; H01L 21/32
  USPC .......................... 438/717, 719, 723, 725, 736
  See application file for complete search history.

(56) References Cited

U.S. PATENT DOCUMENTS

| | | | |
|---|---|---|---|
| 7,790,360 B2 | 9/2010 | Alapati et al. | |
| 7,807,575 B2 | 10/2010 | Zhou | |
| 7,972,967 B1 | 7/2011 | Hyun | |
| 8,057,692 B2 | 11/2011 | Park et al. | |
| 8,110,506 B2 | 2/2012 | Min et al. | |
| 8,969,215 B2* | 3/2015 | Sim ..................... | H01L 21/0337 216/47 |

(Continued)

FOREIGN PATENT DOCUMENTS

| | | |
|---|---|---|
| JP | 2010-245173 | 10/2010 |
| KR | 10-2009-0049524 A | 5/2009 |
| KR | 10-2012-0004712 A | 1/2012 |

*Primary Examiner* — Lan Vinh
(74) *Attorney, Agent, or Firm* — Myers Bigel & Sibley

(57) ABSTRACT

Methods of fabricating semiconductor devices are provided including performing two photolithography processes and two spacer processes such that patterns are formed to have a pitch that is smaller than a limitation of photolithography process. Furthermore, line and pad portions are simultaneously defined by performing the photolithography process once and, thus, there is no necessity to perform an additional photolithography process for forming the pad portion. Related devices are also provided.

12 Claims, 55 Drawing Sheets

(56) References Cited

U.S. PATENT DOCUMENTS

| | | |
|---|---|---|
| 2008/0070165 A1 | 3/2008 | Fischer et al. |
| 2011/0034004 A1 | 2/2011 | Jang et al. |
| 2011/0062595 A1 | 3/2011 | Sim et al. |
| 2011/0095338 A1 | 4/2011 | Scheuerlein et al. |
| 2011/0124198 A1 | 5/2011 | Lee et al. |
| 2011/0318931 A1* | 12/2011 | Min .................... H01L 21/0337 438/696 |
| 2012/0049377 A1* | 3/2012 | Yang .................... H01L 21/0337 257/773 |
| 2012/0142194 A1 | 6/2012 | Hwang |

* cited by examiner

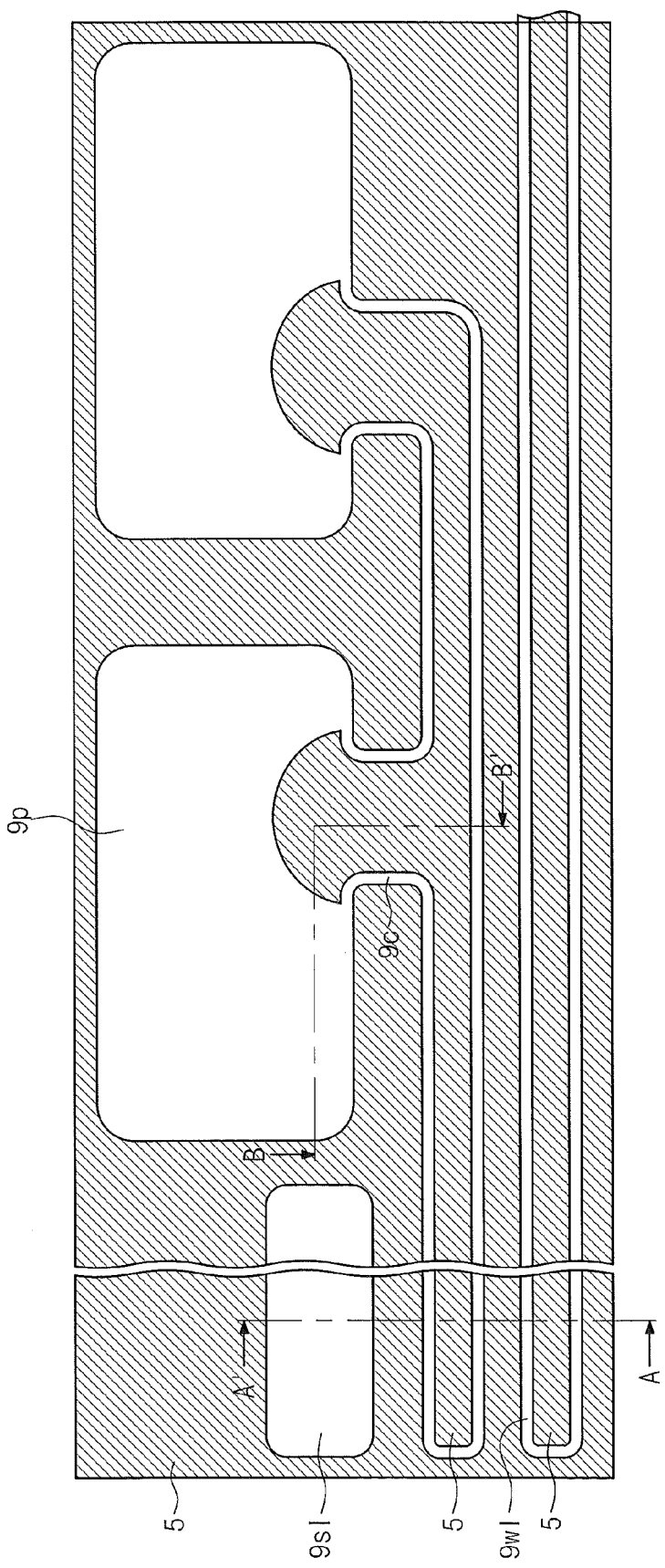

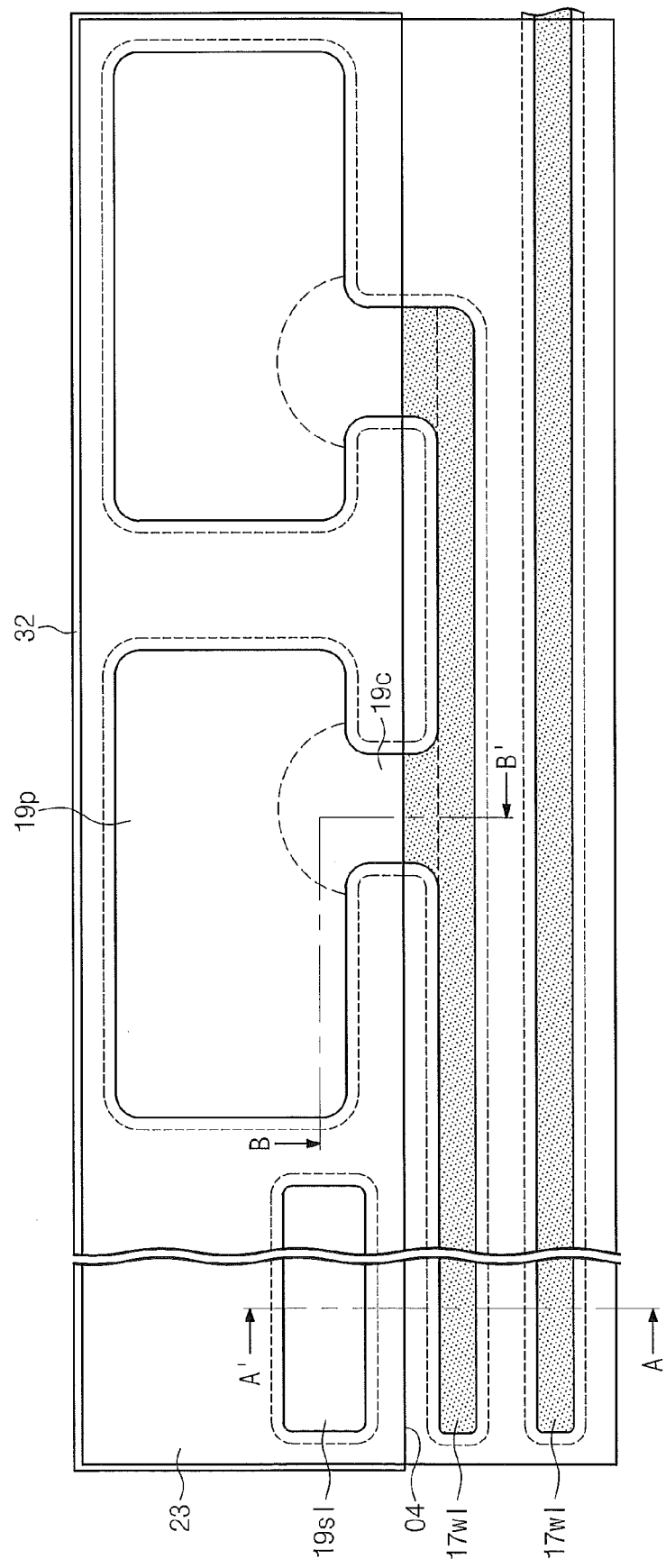

METHODS OF FABRICATING SEMICONDUCTOR DEVICES AND DEVICES FABRICATED THEREBY

CROSS-REFERENCE TO RELATED APPLICATION

This is a continuation-in-part application of U.S. patent application Ser. No. 14/079,282, filed Nov. 13, 2013, which claims priority to Korean Patent Application No. 10-2012-0131829, filed Nov. 20, 2012, the contents of which are hereby incorporated herein by reference in their entireties.

FIELD

The present inventive concept relates generally to semiconductor devices and, more particularly, to methods of fabricating semiconductor devices using double patterning technology and semiconductor devices fabricated thereby.

BACKGROUND

Double patterning technology allows for manufacturers to achieve a small feature size that is beyond a resolution limitation of an exposure system. For example, using conventional double patterning technology, the formation of fine pitch patterns may include forming sacrificial patterns using, for example, a photolithography process, forming spacers on sidewalls of the sacrificial patterns, removing the sacrificial patterns, and etching an etch target layer using the spacers as an etch mask. However, as integration density of the semiconductor device increases, there is an increasing demand for more advanced patterning methods.

SUMMARY

Some embodiments of the inventive concept provide a fabrication method capable of realizing fine patterns, without bridge or mask misalignment.

Other some embodiments of the inventive concept provide highly integrated and highly reliable semiconductor devices.

According to example embodiments of the inventive concept, a method of fabricating a semiconductor device may include forming an etch-target layer and a first mask layer on a substrate; forming a second mask pattern on the first mask layer, the second mask pattern including a second line portion, a second pad portion, and a second connecting portion interposed between the second line portion and the second pad portion; forming a photoresist pattern on the second pad portion; forming a first spacer to cover a sidewall of the second mask pattern; removing the second line portion and the second connecting portion using the photoresist pattern as an etch mask; etching the first mask layer to form a first mask pattern including a first line portion, a first connecting portion, and a first preliminary pad portion, which have shapes corresponding to those of portions of the first spacer covering the second line portion, the second connecting portion, and the second pad portion, respectively, in plan view; partially removing end portions of the first line portion and the first preliminary pad portion to form a pair of first pad portions spaced apart from each other; forming a second spacer to cover a sidewall of the first mask pattern; removing the first line portion and the first connecting portion; and etching the etch-target layer using the first pad portion and the second spacer as an etch mask.

In example embodiments, the photoresist pattern may include a recessed opening overlapped with the second connecting portion, and the removing of the second connecting portion may be performed to remove the second connecting portion overlapped with the recessed opening.

In example embodiments, a width of the second line portion may be three times that of the first line portion.

In example embodiments, a width of the first spacer may be substantially equivalent to that of the second spacer.

In example embodiments, the removing of the second line portion and the second connecting portion may be performed using an anisotropic etching process.

In example embodiments, the partial removing of the first preliminary pad portion may be performed using an isotropic etching process.

In example embodiments, the method may further include forming a third mask layer on the first mask layer, before the forming of the second mask pattern, and etching the third mask layer using the second mask pattern and the first spacer as an etch mask to form a third mask pattern, after the removing of the second line portion and the second connecting portion. The etching of the first mask layer may be performed using the third mask pattern as an etch mask.

In example embodiments, the forming of the second mask pattern may include forming a second mask layer on the third mask layer, forming a fourth mask pattern on the second mask layer, the fourth mask pattern including a fourth line portion, a fourth pad portion, and a fourth connecting portion interposed between the fourth line portion and the fourth pad portion, and patterning the second mask layer using the fourth mask pattern as an etch mask to form the second mask pattern. When the patterning of the second mask layer is finished, the fourth line portion may be formed to have a height that is smaller than those of the fourth pad portion and the fourth connecting portion, and when the forming of the first spacer is finished, the fourth line portion may be removed to expose a top surface of the second line portion and the fourth connecting portion and the fourth pad portion remain on the second connecting portion and the second pad portion.

In example embodiments, the first spacer may be formed to cover the second and fourth mask patterns. In this case, the method may further include forming the photoresist pattern on the first spacer covering the second and fourth mask patterns to cover the fourth pad portion and have an opening overlapped with the fourth connecting portion and the fourth line portion, and removing the fourth connecting portion and the fourth line portion using the photoresist pattern as an etch mask to expose top surfaces of the second connecting portion and the second line portion.

In example embodiments, the first mask layer and the second mask layer may be formed of the same material, the third mask layer and the fourth mask pattern may be formed of the same material, and the first spacer and the second spacer may be formed of the same material.

In example embodiments, a space between adjacent ones of the second line portions may be five times a width of the second spacer.

According to example embodiments of the inventive concept, a semiconductor device may include at least one interconnection including a line portion and a pad portion connected to each other. The pad portion may have a width greater than that of the line portion and have concave sidewalls and a linear sidewall therebetween.

In example embodiments, the device may further include at least one extension connected to the pad portion and spaced apart from the line portion. The extension may have the same width as the line portion.

In example embodiments, the at least one interconnection may include a pair of interconnection lines that are disposed adjacent to each other and are configured in such a way that a distance between the pad portions thereof is greater than a distance between the line portions thereof.

In example embodiments, the concave sidewalls may include a first concave sidewall and a second concave sidewall, the first concave sidewall extends along a first direction parallel to a top surface of a substrate, the second concave sidewall extends along a second direction crossing the first direction, and the linear sidewall extends along the second direction.

In example embodiments, the at least one interconnection may include first to fourth interconnections, which are provided adjacent to each other and have first to fourth pad portions, respectively. Shapes of the first and fourth pad portions may have substantially mirror symmetry with respect to a midpoint therebetween, and shapes of the second and third pad portions may have substantially mirror symmetry with respect to a midpoint therebetween.

In example embodiments, the device may further include at least one dummy interconnection interposed between the second and third interconnections.

BRIEF DESCRIPTION OF THE DRAWINGS

Some embodiments will be more clearly understood from the following brief description taken in conjunction with the accompanying drawings. The accompanying drawings represent non-limiting, some embodiments as described herein.

FIGS. 1A through 18A are plan views illustrating processing steps in the fabrication of semiconductor devices according to some embodiments of the present inventive concept.

FIGS. 1B through 18B are cross-sections taken along the lines A-A' and B-B' of FIGS. 1A through 18A, respectively.

FIGS. 19A through 21A are plan views illustrating processing steps in the fabrication of semiconductor devices according to some embodiments of the present inventive concept.

FIGS. 19B through 21B are cross-sections taken along lines A-A' and B-B' of FIGS. 19A through 21A, respectively.

FIGS. 22A through 24A and 25 through 28 are plan views illustrating processing steps in the fabrication of semiconductor devices according to some embodiments of the present inventive concept.

FIGS. 22B through 24B are cross-sections taken along lines A-A' and B-B' of FIGS. 22A through 24A, respectively.

Figure 1A:
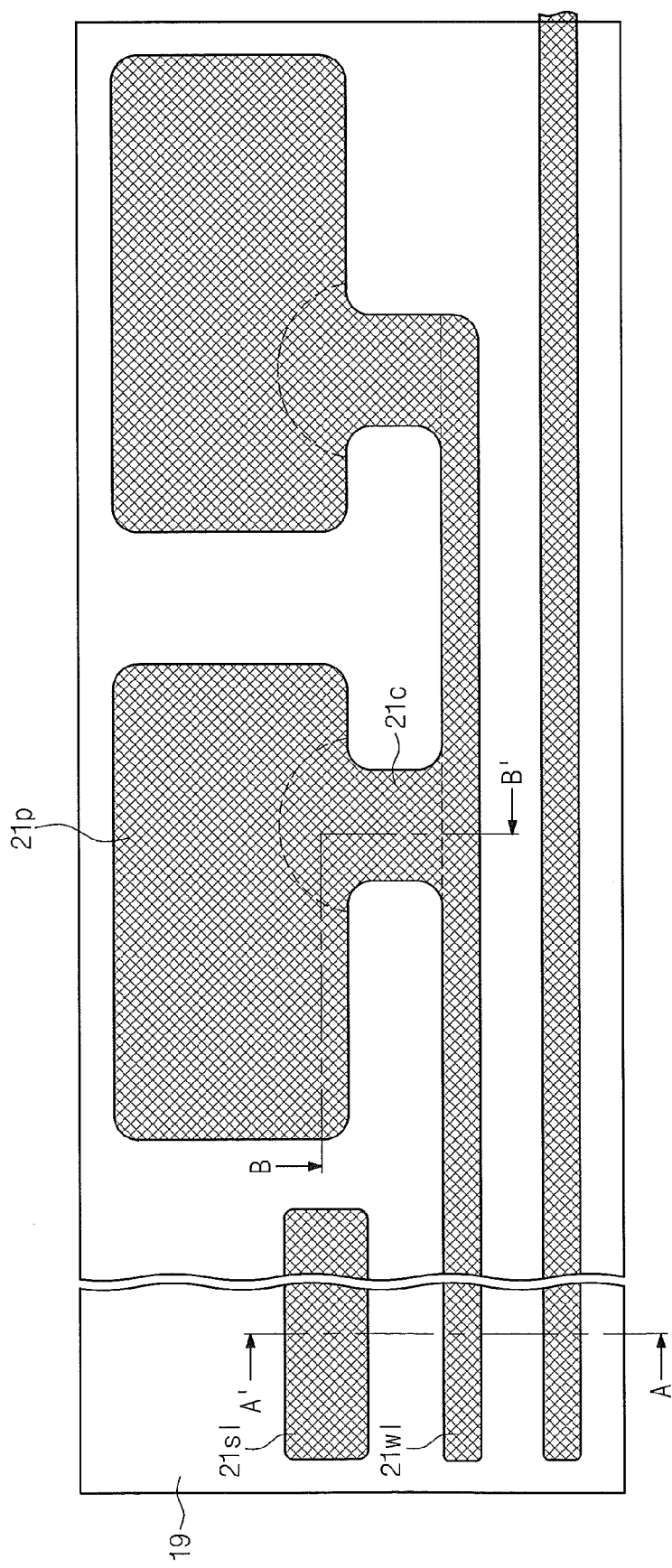

It should be noted that these figures are intended to illustrate the general characteristics of methods, structures and/or materials utilized in certain some embodiments and to supplement the written description provided below. These drawings may not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Some embodiments of the inventive concepts will now be described more fully with reference to the accompanying drawings, in which some embodiments are shown. Some embodiments of the inventive concepts may, however, be embodied in many different forms and should not be construed as being limited to the embodiments set forth herein; rather, these embodiments are provided so that this disclosure will be thorough and complete, and will fully convey the concept of some embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Some embodiments of the inventive concepts are described herein with reference to cross-sectional illustrations that are schematic illustrations of idealized embodiments (and intermediate structures) of some embodiments. As such, variations from the shapes of the illustrations as a result, for example, of manufacturing techniques and/or tolerances, are to be expected. Thus, some embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of some embodiments.

Unless otherwise defined, all terms (including technical and scientific terms) used herein have the same meaning as commonly understood by one of ordinary skill in the art to which some embodiments of the inventive concepts belong. It will be further understood that terms, such as those defined in commonly-used dictionaries, should be interpreted as having a meaning that is consistent, with their meaning in the context of the relevant art and will not be interpreted in an idealized or overly formal sense unless expressly so defined herein.

FIG. 1A through 18A are plan views illustrating processing steps in the fabrication of semiconductor devices according to some embodiments of the present inventive concept. FIGS. 1B through 18B are cross-sections taken along lines A-A' and B-B' of FIGS. 1A through 18A, respectively.

Figure 1B:
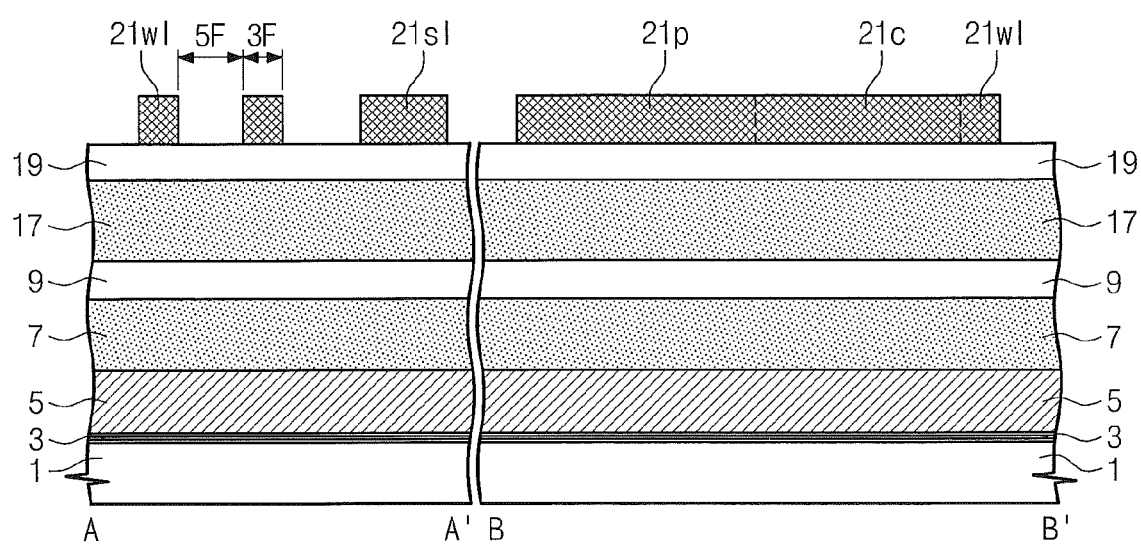

Referring first to FIGS. 1A and 1B, a gate insulating layer 3, a conductive layer 5, a first mask layer 7, a second mask layer 9, a third mask layer 17, and a fourth mask layer 19 may be sequentially formed on a substrate 1. The substrate 1 may be, for example, a single crystalline silicon wafer or a silicon-on-insulator (SOI) wafer. In some embodiments, at least a portion of the conductive layer 5 may serve as an etch-target layer. The conductive layer 5 may include a doped polysilicon layer, a metal silicide layer, and/or a metal layer. The gate insulating layer 3 may be a single- or multi-layered structure including at least one of a silicon oxide layer, a silicon nitride layer, or a metal oxide layer. The gate insulating layer 3 may include a tunnel insulating layer, a charge storing layer, and a blocking insulating layer, which may be sequentially stacked on the substrate 1. Alternatively, the charge storing layer may be replaced with a floating conductive pattern. The first and third mask layers 7 and 17 may include the same material, for example, spin-on-hardmask (SOH) or spin-on-carbon (SOC) layer. Similarly, the second and fourth mask layers 9 and 19 may include the same material, for example, a silicon oxynitride layer (SiON).

First photoresist (PR) patterns may be formed on the fourth mask layer 19 by performing a first photolithography process. The first PR patterns may include a first selection line photoresist (SLPR) pattern 21s1 and a first word line photoresist (WLPR) pattern 21w1, 21c, and 21p. The first WLPR pattern 21w1, 21c, and 21p may include a first PR line portion 21w1, a first PR pad portion 21p, and a first PR connecting portion 21c connecting them. The first PR pad portion 21p and the first PR connecting portion 21c may be provided at a side of an end portion of the first PR line portion 21w1. The first WLPR pattern may include a pair of symmetric pad portions 21p and a pair of symmetric connecting portions 21c. A width of the first SLPR pattern 21s1 may be greater than that of the first PR line portion 21w1. The first SLPR pattern 21s1 may be formed to realize a ground selection line or a string selection line of NAND FLASH memory devices, while the first WLPR pattern may be formed to realize word lines of the NAND FLASH memory devices. In some embodiments, the width of the line portion 21w1 may be about three times a final width 1 F of the word line. A space between the line portions 21w1 disposed adjacent to each other may be about five times the final width 1 F of the word line.

In embodiments where the gate insulating layer 3 includes the tunnel insulating layer, the charge storing layer, and the blocking insulating layer, there may be no charge storing layer below the first SLPR pattern 21s1. For example, below the first SLPR pattern 21s1, the tunnel insulating layer may be in direct contact with the blocking insulating layer or one of the tunnel insulating layer and the blocking insulating layer may exist.

Figure 2A:
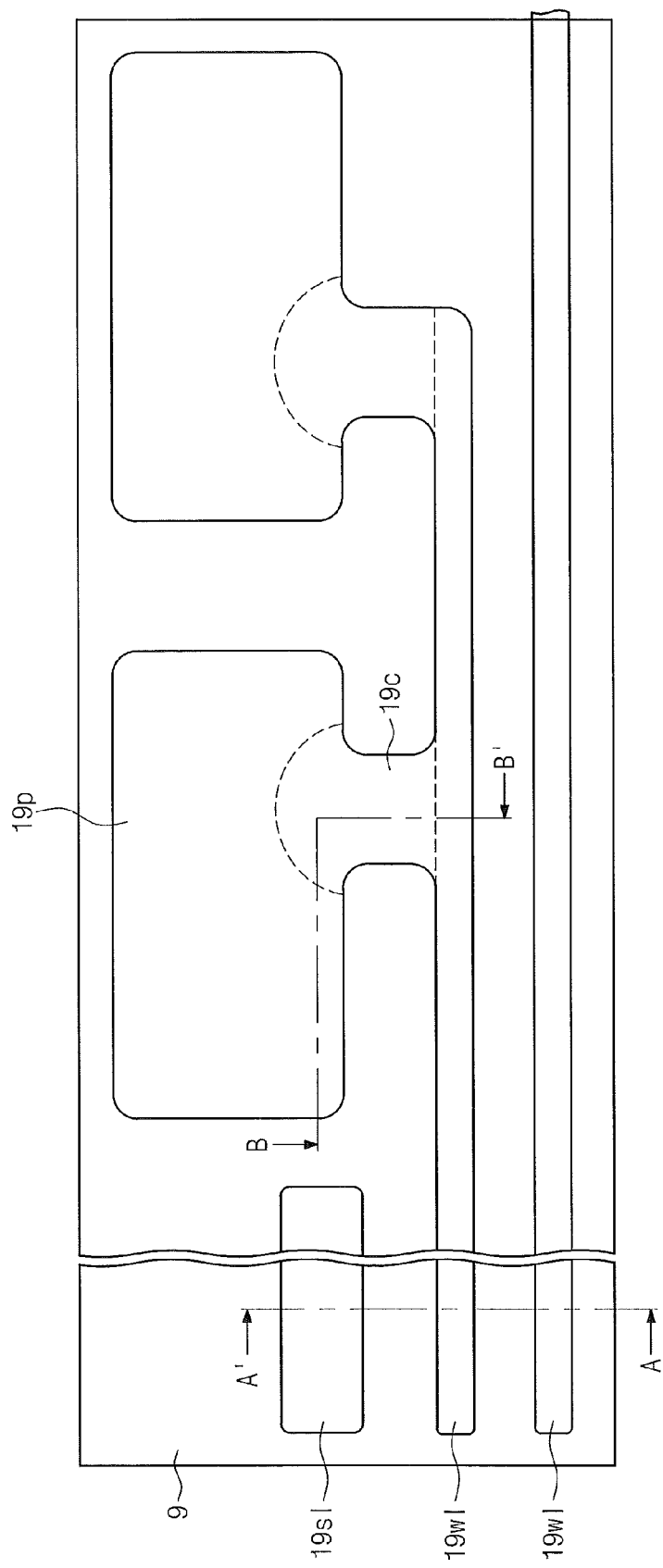
Figure 2B:
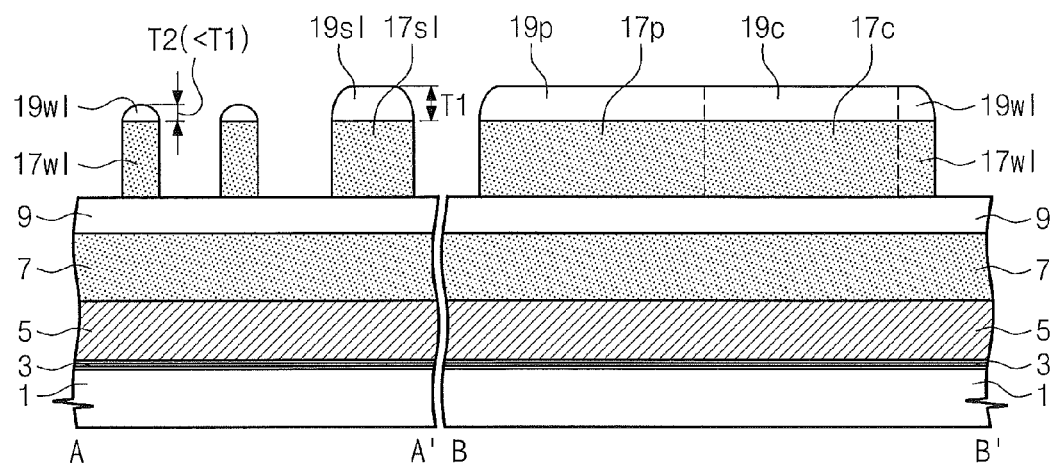

Referring to FIGS. 2A and 2B, the fourth mask layer 19 may be etched using the first PR patterns 21s1, 21w1, 21p, and 21c as an etch mask to form fourth mask patterns 19s1, 19w1, 19p, and 19c. The fourth mask patterns 19s1, 19w1, 19p, and 19c may be formed to have shapes transferred from the first PR patterns 21s1, 21w1, 21p, and 21c, respectively. The fourth mask patterns 19s1, 19w1, 19p, and 19c may include a fourth selection line (SL) mask pattern 19s1 and a fourth word line (WL) mask pattern 19w1, 19c, and 19p. The fourth WL mask pattern 19w1, 19c, and 19p may include a fourth mask line portion 19w1, a fourth mask pad portion 19p, and a fourth mask connecting portion 19c connecting them.

The third mask layer 17 may be etched using the fourth mask patterns 19s1, 19w1, 19p, and 19c as an etch mask to form third mask patterns 17s1, 17w1, 17p, and 17c. The third mask patterns 17s1, 17w1, 17p, and 17c may be formed to have shapes transferred from the fourth mask patterns 19s1, 19w1, 19p, and 19c, respectively. The third mask patterns 17s1, 17w1, 17p, and 17c may include a third SL mask pattern 17s1 and a third WL mask pattern 17w1, 17c, and 17p. The third WL mask pattern 17w1, 17c, and 17p may include a third mask line portion 17w1, a third mask pad portion 17p, and a third mask connecting portion 17c connecting them.

During the formation of the third mask patterns 17s1, 17w1, 17p, and 17c, the first PR patterns 21s1, 21w1, 21p, and 21c may be wholly removed to expose the top surfaces of the fourth mask patterns 19s1, 19w1, 19p, and 19c. Alternatively, the first PR patterns 21s1, 21w1, 21p, and 21c may be removed before the etching of the third mask patterns 17s1, 17w1, 17p, and 17c. During the etching of the third mask patterns 17s1, 17w1, 17p, and 17c, the fourth mask patterns 19s1, 19w1, 19p, and 19c may be partially etched. An etch damage is most likely to occur at the fourth mask line portion 19w1 having a relatively small pattern width than at the fourth SL mask pattern 19s1, the fourth mask pad portion 19p, and the fourth mask connecting portion 19c having a relatively large pattern width. Accordingly, a thickness T2 of the fourth mask line portion 19w1 may be smaller than a thickness T1 of the fourth SL mask pattern 19s1, the fourth mask pad portion 19p, and the fourth mask connecting portion 19c.

Figure 3A:
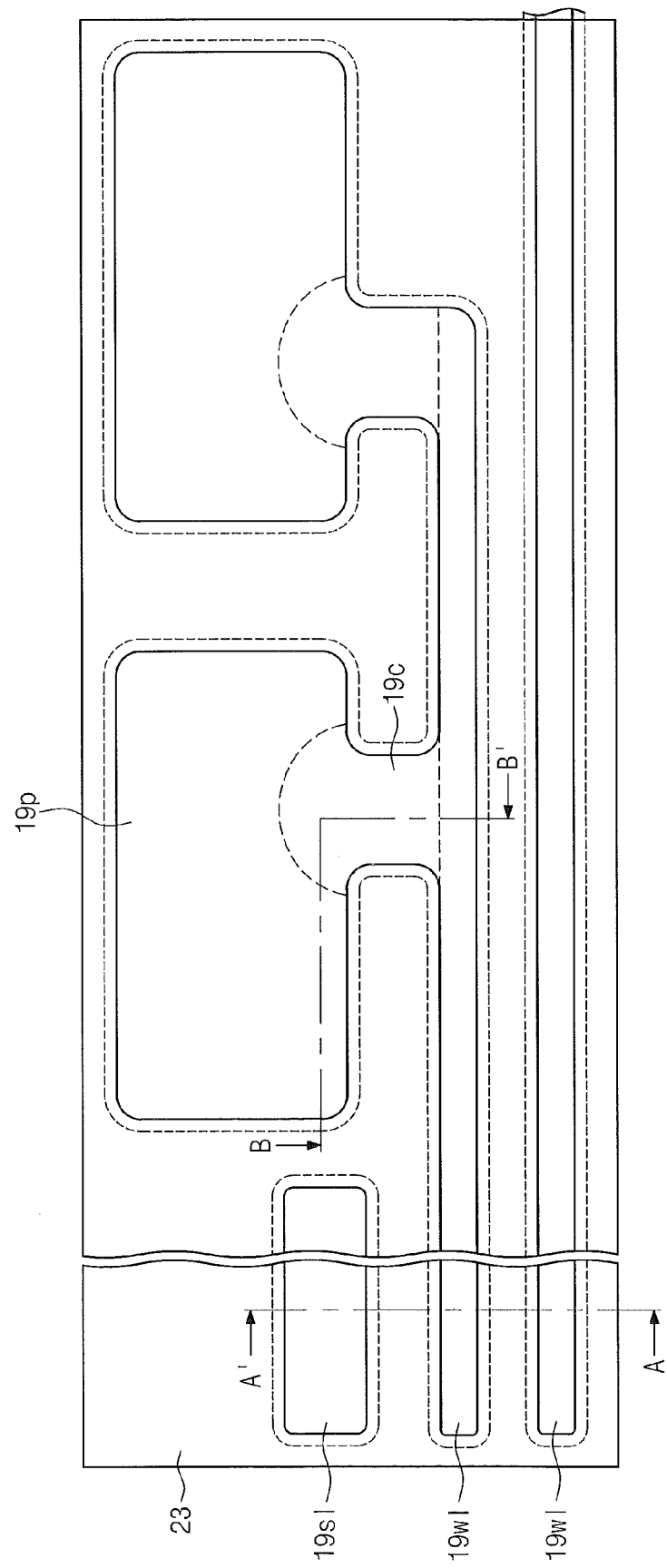
Figure 3B:
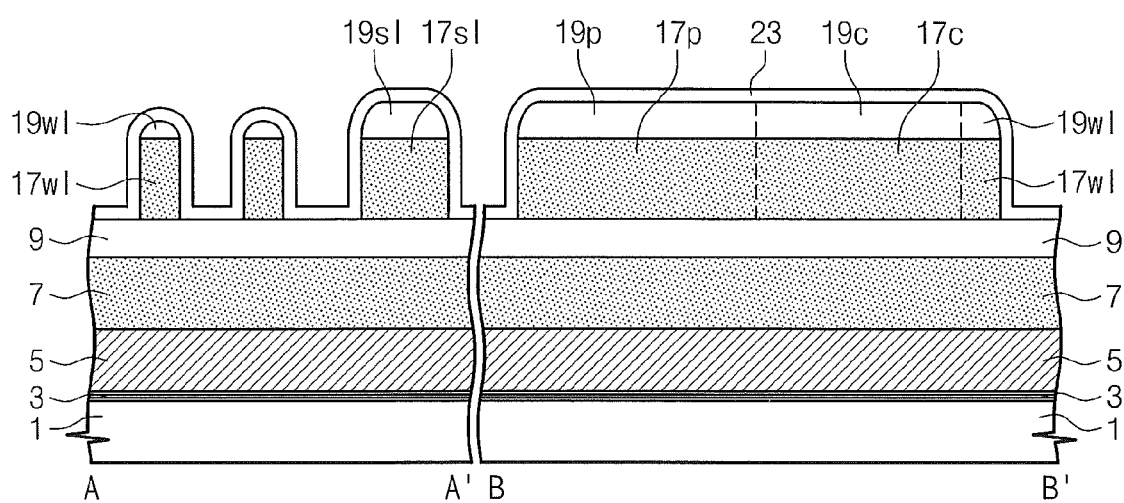

Referring to FIGS. 3A and 3B, a first spacer layer 23 may be conformally formed on the substrate 1. In some embodiments, the first spacer layer 23 may be formed of a material having an etch selectivity with respect to all of the second to fourth mask layers 9, 17, and 19. For example, the first spacer layer 23 may be formed of a silicon oxide layer that was formed using an atomic layer deposition (ALD) process. The first spacer layer 23 may have a thickness that is substantially equivalent to the final width 1 F of the word line.

Figure 4A:
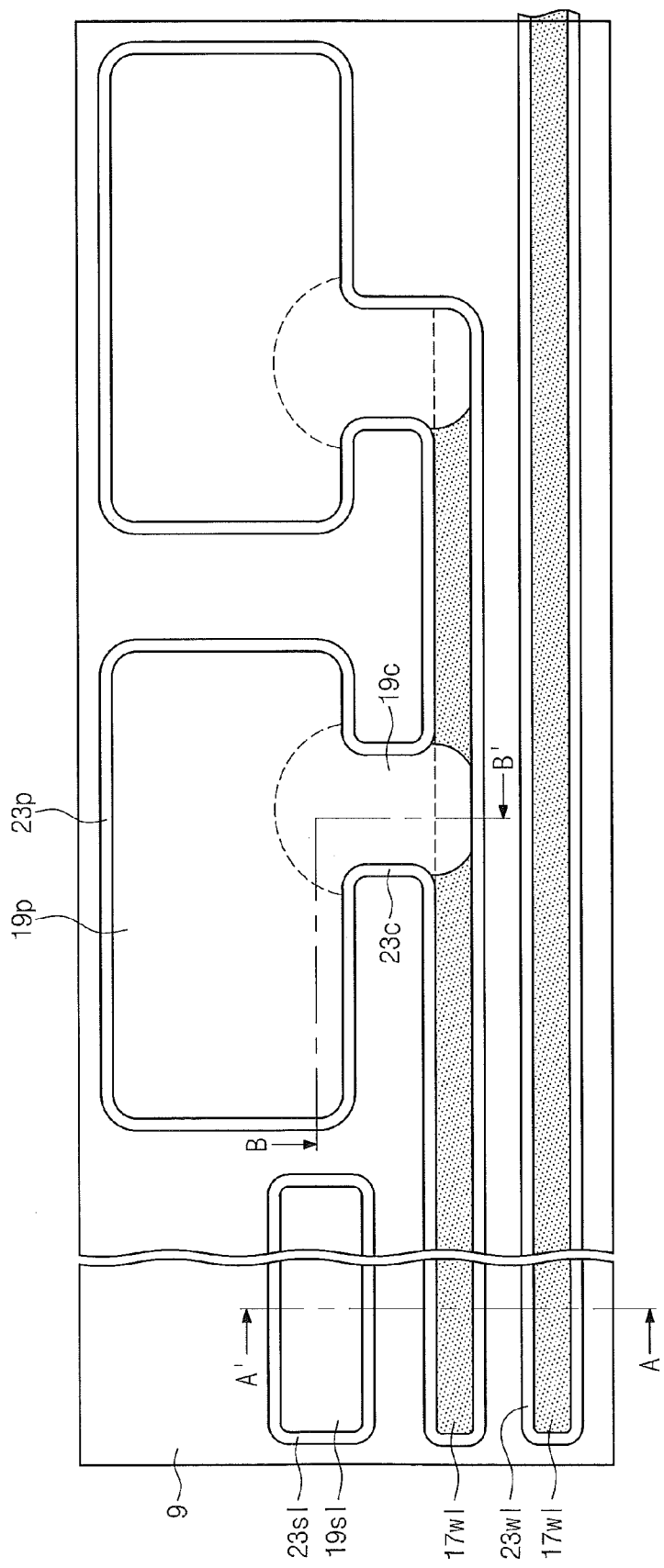
Figure 4B:
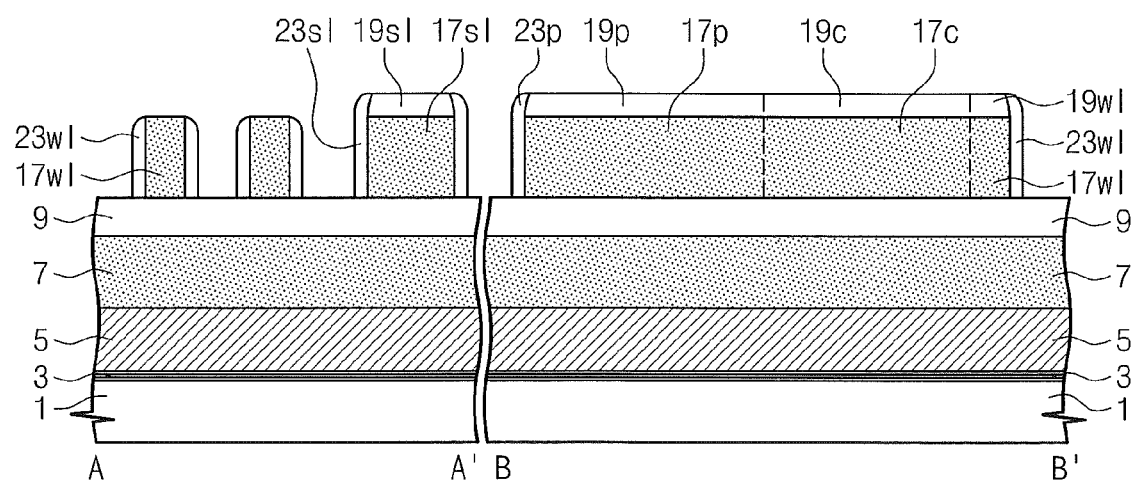

Referring to FIGS. 4A and 4B, the first spacer layer 23 may be etched to form first spacers 23s1, 23w1, 23p, and 23c covering sidewalls of the third mask patterns 17s1, 17w1, 17p, and 17c and expose a top surface of the second mask layer 9. The first spacers 23s1, 23w1, 23p, and 23c may include the first SL spacer 23s1, the first line spacer 23w1, the first pad spacer 23p, and the first connection spacer 23c, which may be formed to cover sidewalls of the third SL mask pattern 17s1, the third mask line portion 17w1, the third mask pad portion 17p, and the third mask connecting portion 17c, respectively. Thereafter, the fourth mask line portion 19w1 may be removed to expose a top surface of the third mask line portion 17w1. In some embodiments, the fourth SL mask pattern 19s1, the fourth mask pad portion 19p, and the fourth mask connecting portion 19c may have the thickness T1 greater than the thickness T2 of the fourth mask line portion 19w1, and in these embodiments, the fourth SL mask pattern 19s1, the fourth mask pad portion 19p, and the fourth mask connecting portion 19c may not be wholly removed to remain, during the etching process for removing the fourth mask line portion 19w1.

Figure 5A:
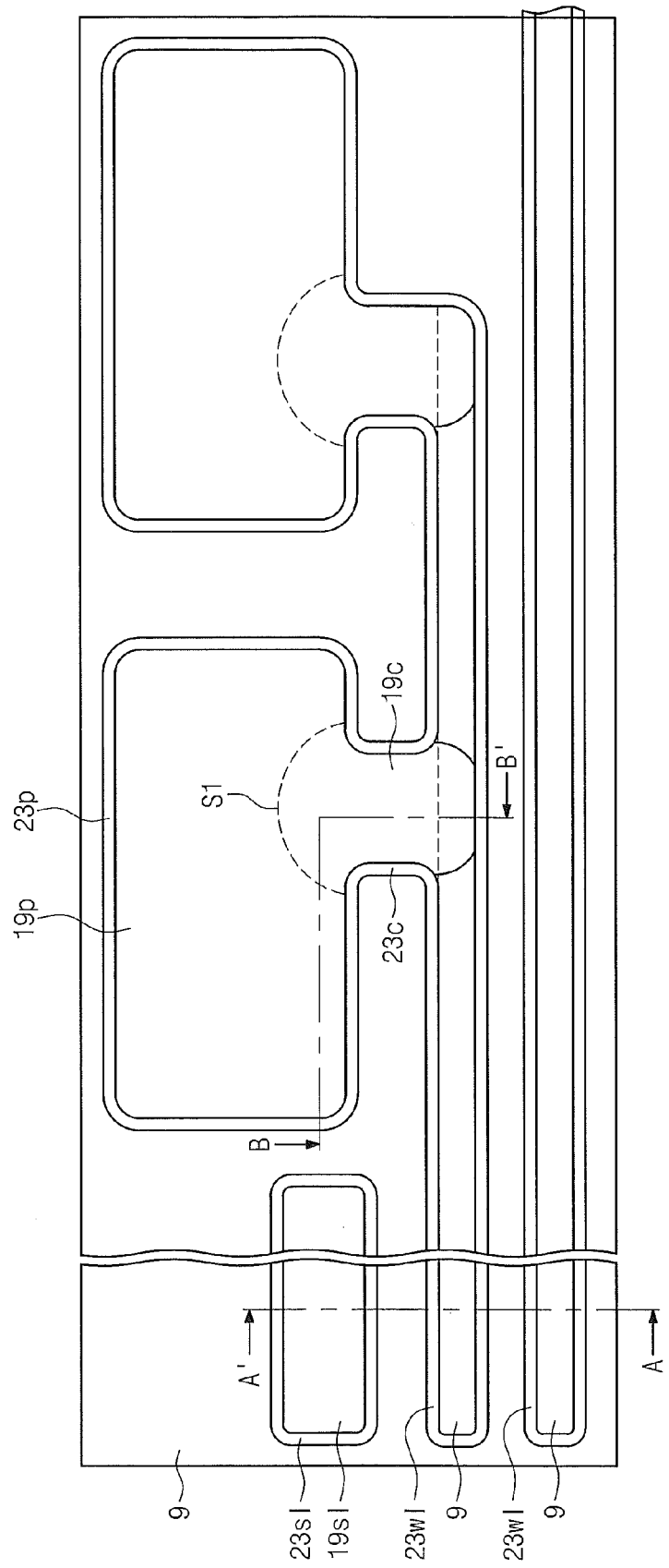
Figure 5B:
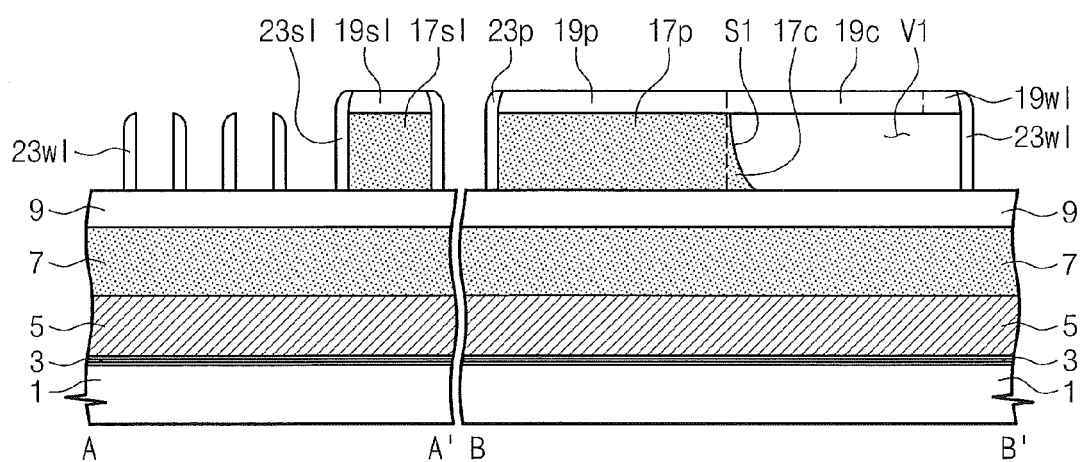

Referring to FIGS. 5A and 5B, an isotropic etching process may be performed to remove selectively the exposed third mask line portion 17w1 and expose inner sidewalls of the first line spacers 23w1 and a top surface of the second mask layer 9 between the first line spacers 23w1. In embodiments where the third mask layer 17 is formed of an SOH layer, the isotropic etching process may be an ashing process using oxygen. During the isotropic etching process, etchant may seep below the fourth mask connecting portion 19c and remove a large portion of the third mask connecting portion 17c. In some embodiments, the remaining portion of the third mask connecting portion 17c may have a first sidewall S1 with a concave profile. As the result of the partial removal of the third mask connecting portion 17c, a first empty space V1 may be formed to expose a bottom surface of the fourth mask connecting portion 19c.

Figure 6A:
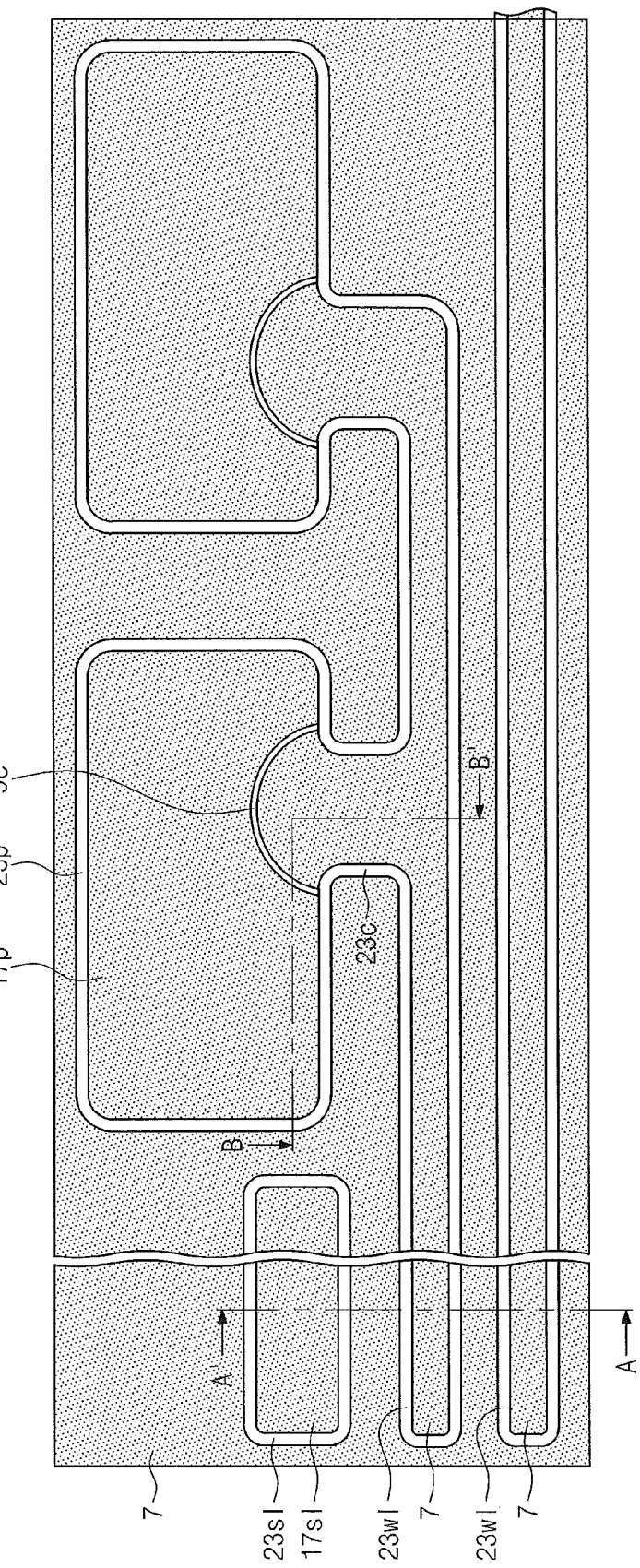
Figure 6B:
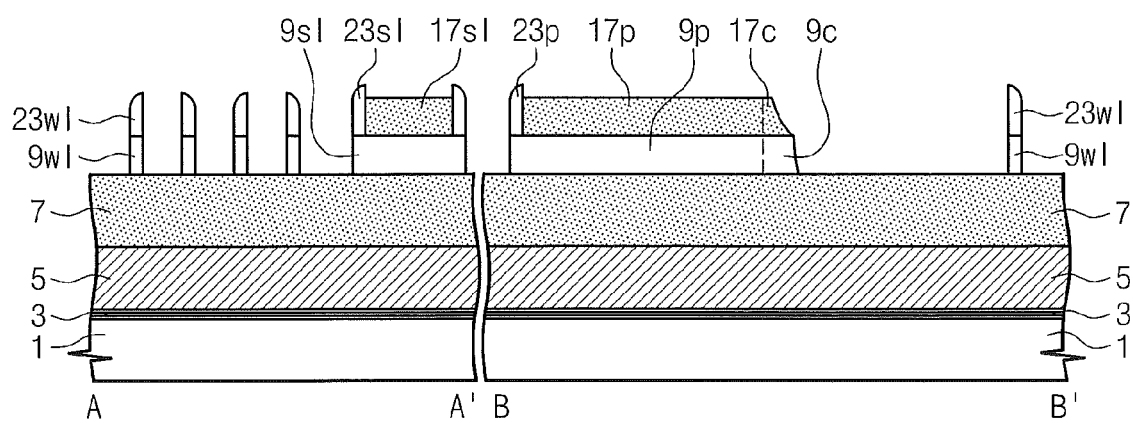

Referring now to FIGS. 6A and 6B, the second mask layer 9 may be etched using the first spacers 23s1, 23w1, 23p, and 23c, the third SL mask pattern 17s1, and the third mask pad portion 17p as an etch mask to form second mask patterns 9s1, 9w1, 9p, and 9c. If the second mask layer 9 is formed of the same material as the fourth mask layer 19, the fourth mask patterns 19s1, 19w1, 19p, and 19c may be removed during the etching process to form the second mask patterns 9s1, 9w1, 9p, and 9c. If the second mask layer 9 is formed of a different material from the fourth mask layer 19, the fourth mask patterns 19s1, 19w1, 19p, and 19c may be removed by an additional process. In some embodiments, the first mask layer 7 and top surfaces of the third mask patterns 17s1, 17p, and 17c may be exposed as the result of the formation of the second mask patterns 9s1, 9w1, 9p, and 9c.

When viewed from above, the second mask patterns 9s1, 9w1, 9p, and 9c may have shapes corresponding to those of the first spacers 23s1, 23w1, 23p, and 23c, the third SL mask pattern 17s1, and the third mask pad portion 17p. The second mask patterns 9s1, 9w1, 9p, and 9c may include a second SL mask pattern 9s1 and a second WL mask pattern 9w1, 9c, and 9p. The second WL mask pattern 9w1, 9c, and 9p may include a second mask line portion 9w1, a second mask pad portion 9p, and a second mask connecting portion 9c connecting them. A width of the second SL mask pattern 9s1 may be greater by about 2 F than that of the third SL mask pattern 17s1. One third mask line portion 17w1 may be used to form the second mask line portion 9w1 shaped like a closed curve.

Figure 7A:
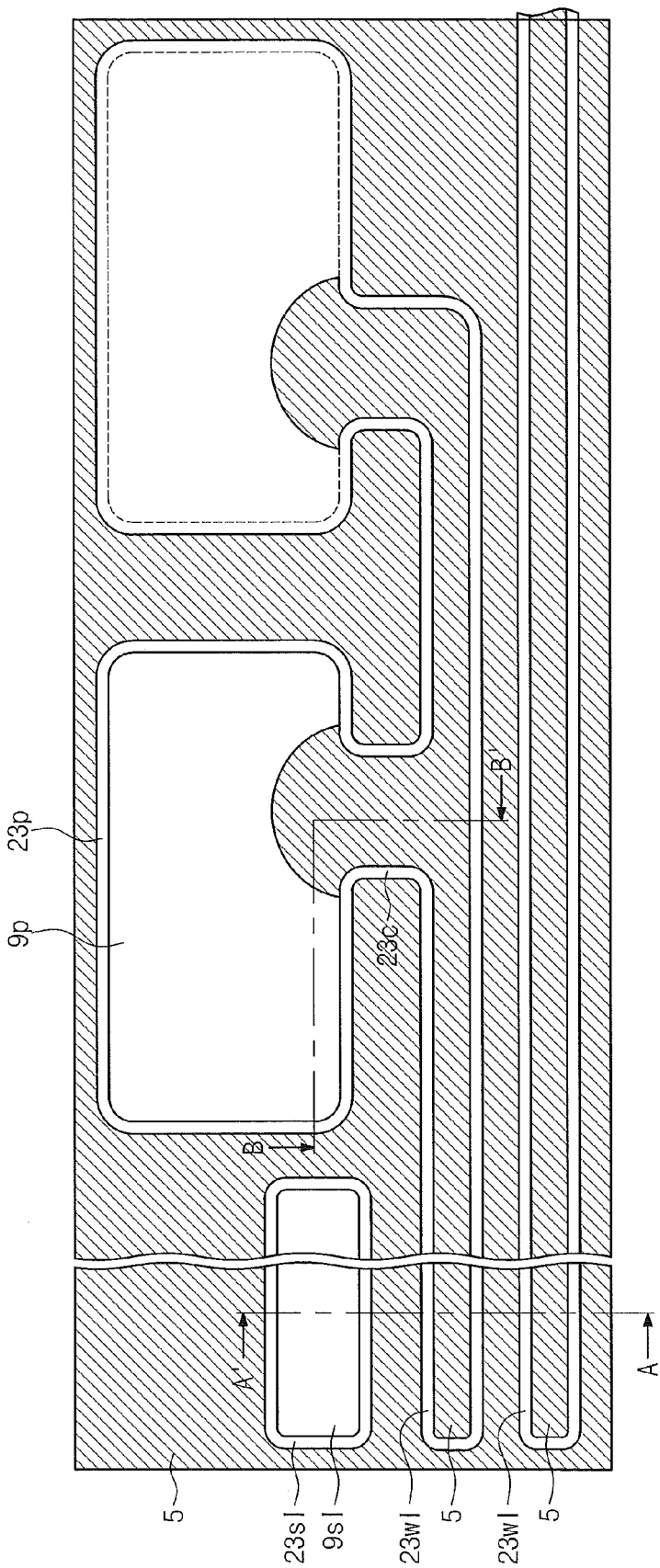
Figure 7B:
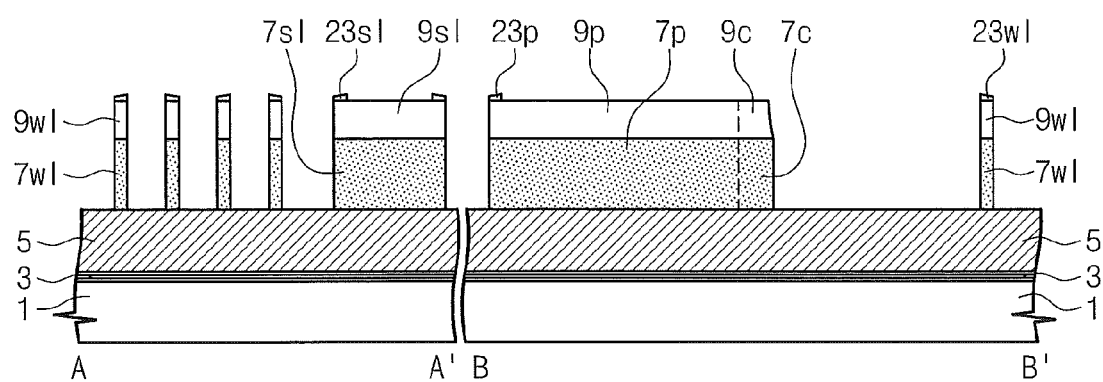

Referring to FIGS. 7A and 7B, the first mask layer 7 may be etched using the second mask patterns 9s1, 9w1, 9p, and 9c as an etch mask to form first mask patterns 7s1, 7w1, 7p, and 7c and expose the conductive layer 5. If the third mask layer 17 and the first mask layer 7 may be formed of the same material, the third mask patterns 17s1, 17w1, 17p, and 17c may be removed during the etching process for forming the first mask patterns 7s1, 7w1, 7p, and 7c. If the third mask layer 17 and the first mask layer 7 are formed of different materials from each other, the third mask patterns 17s1, 17w1, 17p, and 17c may be removed by an additional process. In some embodiments, top surfaces of the second mask patterns 9s1, 9p, and 9c may be exposed as the result of the formation of the first mask patterns 7s1, 7w1, 7p, and 7c. Here, the first spacers 23s1, 23w1, 23p, and 23c may remain.

When viewed from above, the first mask patterns 7s1, 7w1, 7p, and 7c may have shapes corresponding to those of the second mask patterns 9s1, 9w1, 9p, and 9c. The first mask patterns 7s1, 7w1, 7p, and 7c may include a first SL mask pattern 7s1 and a first WL mask pattern 7w1, 7c, and 7p. The first WL mask pattern 7w1, 7c, and 7p may include a first mask line portion 7w1, a first mask preliminary pad portion 7p, and a first mask connecting portion 7c connecting them.

Figure 8B:
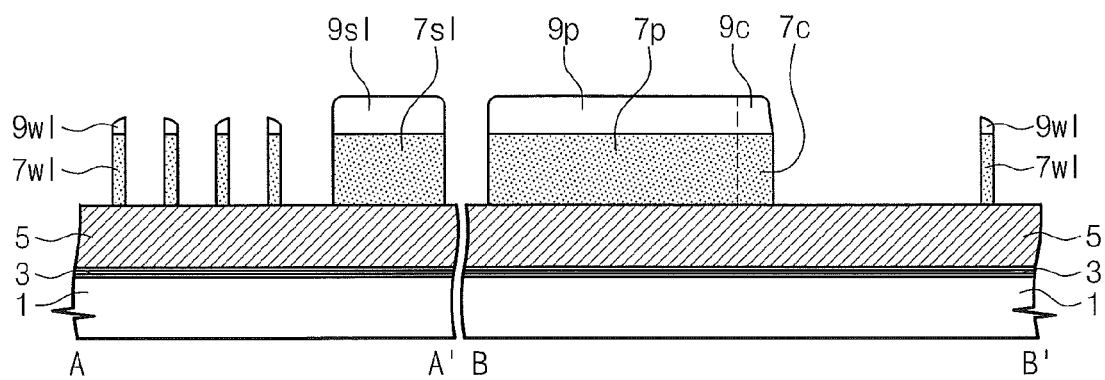

Referring to FIGS. 8A and 8B, the first spacers 23s1, 23w1, 23p, and 23c may be removed. In some embodiments, upper portions of the second mask patterns 9s1, 9w1, 9p, and 9c may be partially etched during removing the first spacers 23s1, 23w1, 23p, and 23c. An etch damage is most likely to occur at the second mask line portions 9w1 having a relatively small pattern width, the fourth mask pad portion 19p, and the fourth mask connecting portion 19c having a relatively large pattern width, and thus, a thickness of the second mask line portions 9w1 may be smaller than thicknesses of the second SL mask pattern 9s1, the second mask pad portion and connecting portion 9p and 9c.

Figure 9A:
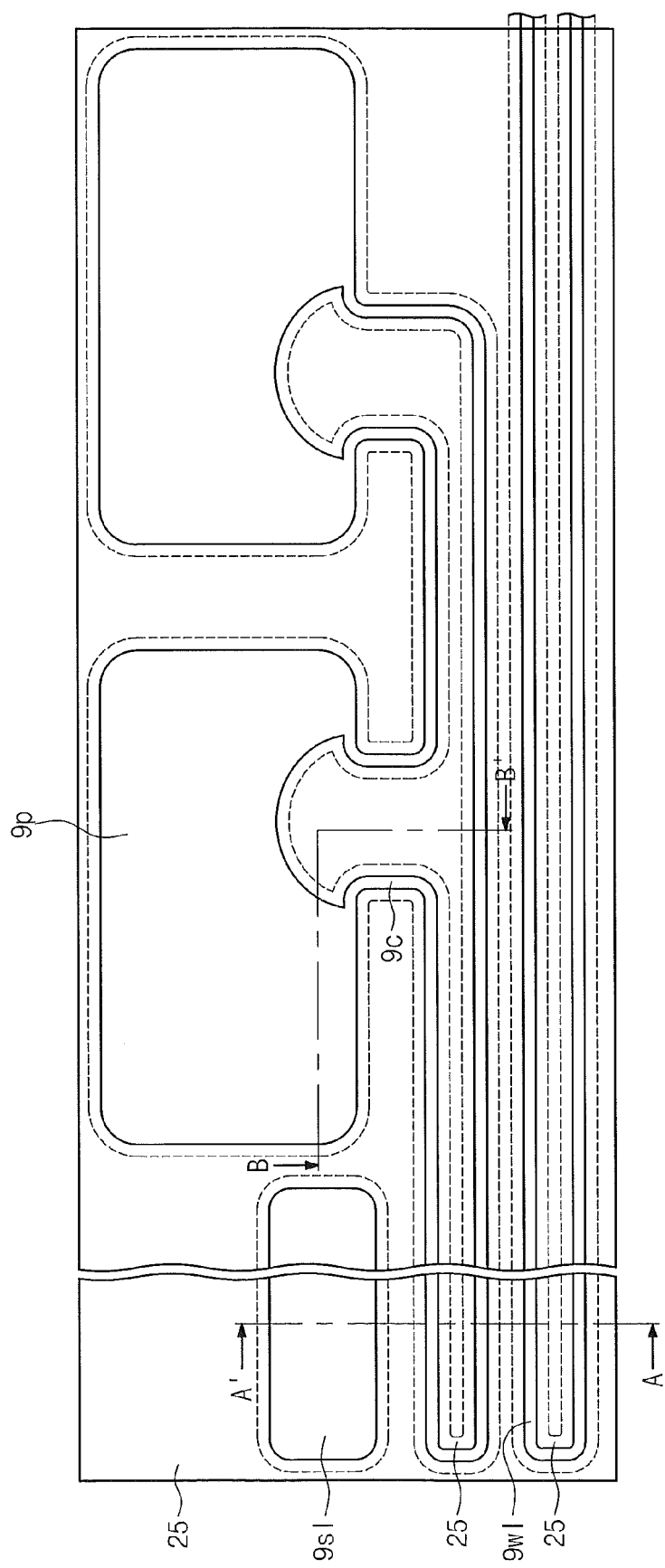
Figure 9B:
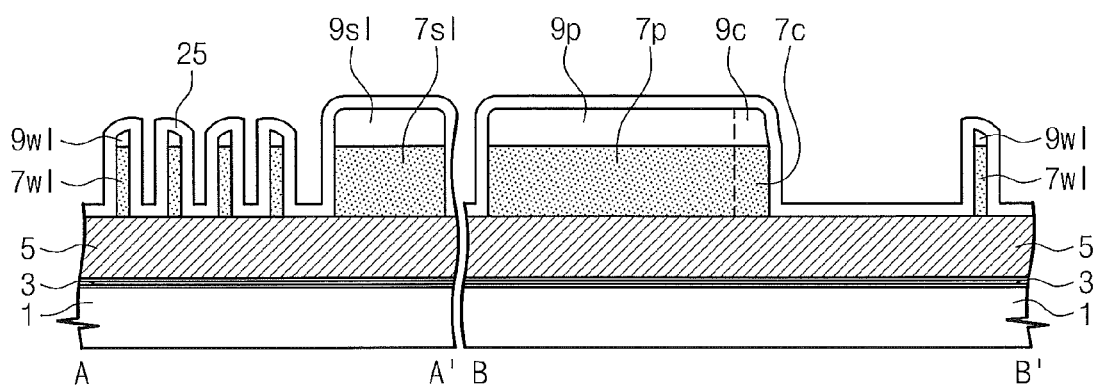

Referring to FIGS. 9A and 9B, a second spacer layer 25 may be conformally formed on the substrate 1. In some embodiments, the second spacer layer 25 may be formed of a material having an etch selectivity with respect to all of the conductive layer 9, the first and second mask layers 7 and 9. For example, the second spacer layer 25 may be a silicon oxide layer formed by an atomic layer deposition (ALD) process. The second spacer layer 25 may have a thickness that is substantially equivalent to the final width 1 F of the word line.

Figure 10A:
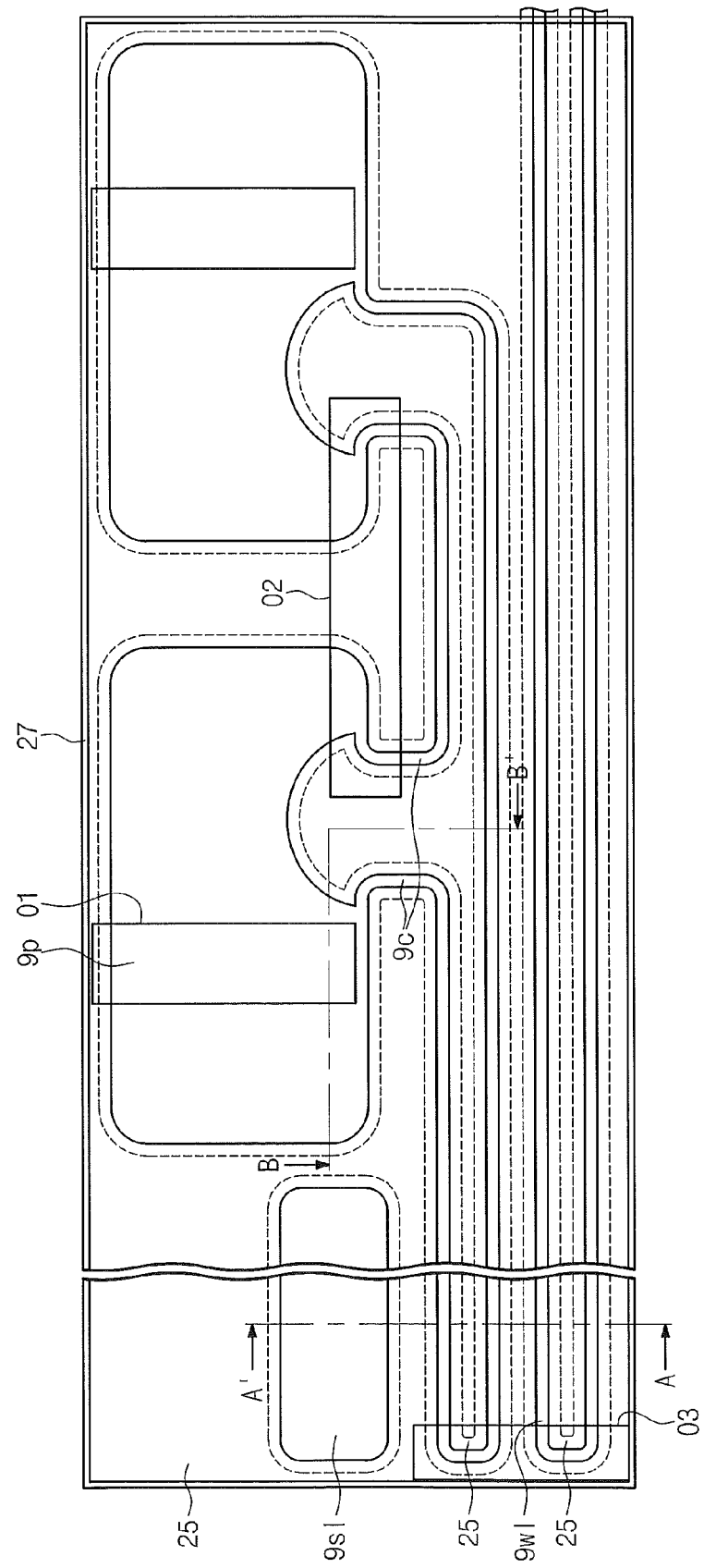
Figure 10B:
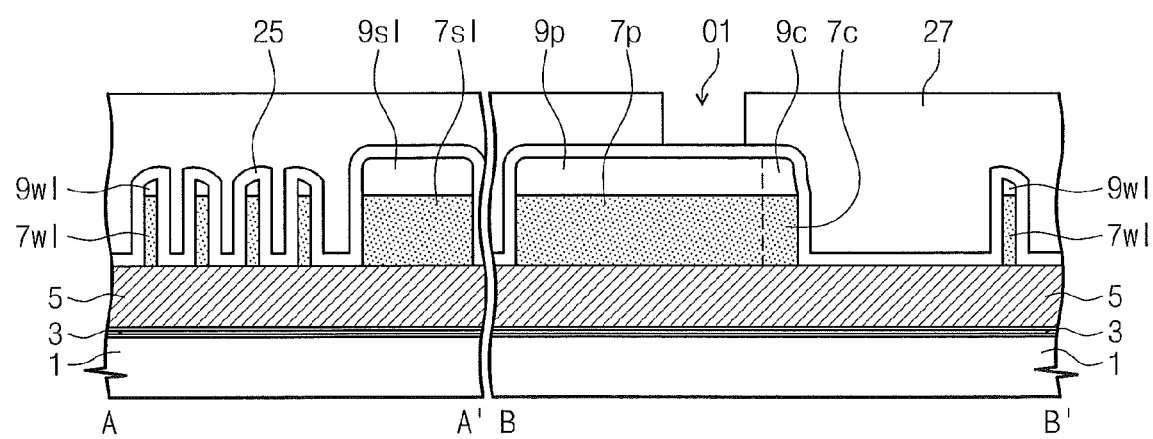

Referring to FIGS. 10A and 10B, a second PR pattern 27 may be formed on the second spacer layer 25 to have first to third openings O1, O2, and O3, by performing a second photolithography process. The first opening O1 may be formed to cross a portion near a center of the second mask pad portion 9p, but it may be formed spaced apart from the second mask connecting portion 9c, in plan view. The second opening O2 may be formed to be overlapped with a pair of the second mask connecting portions 9c, which are connected to two adjacent ones of the second mask pad portions 9p. The third opening O3 may be formed to be overlapped with end portions of the second mask line portions 9w1.

Figure 11A:
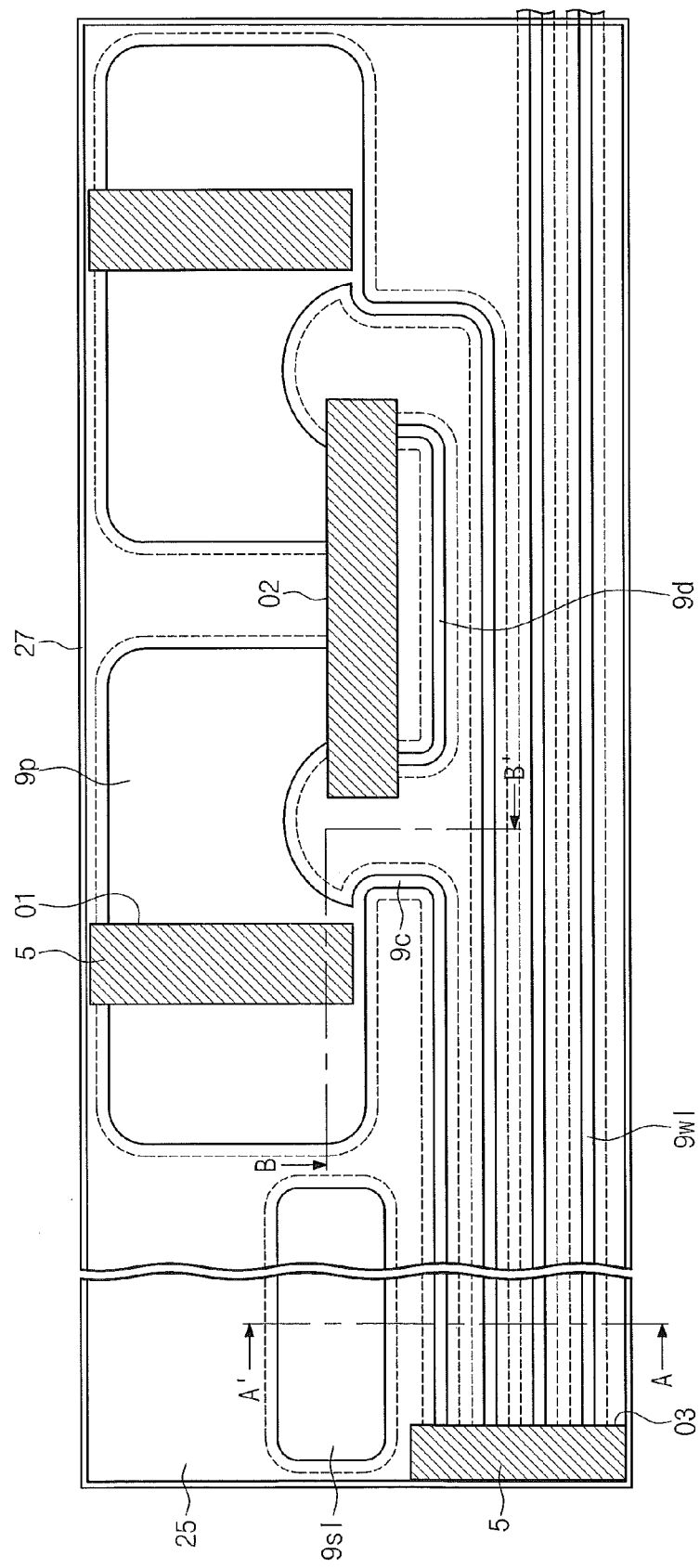
Figure 11B:
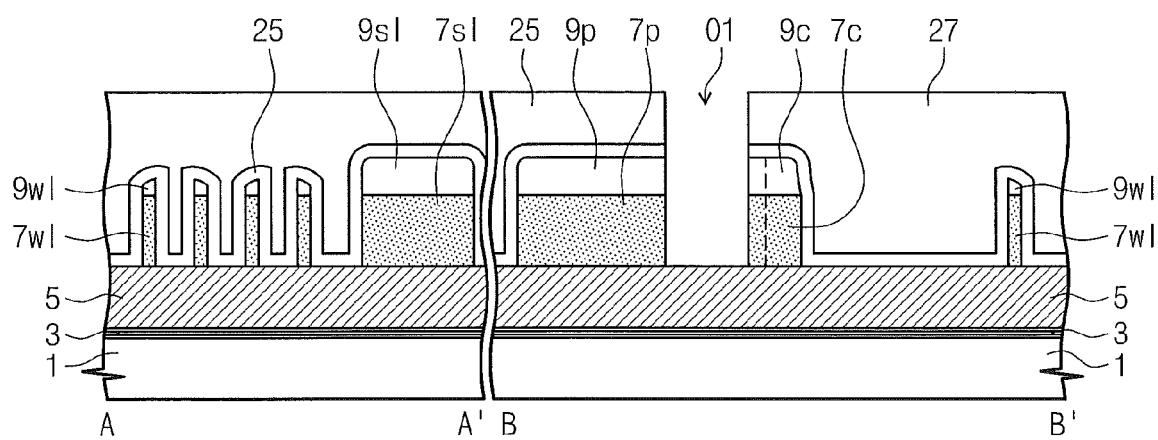

Referring to FIGS. 11A and 11B, the second spacer layer 25, the second WL mask pattern 9w1, 9p, and 9c, and the first WL mask pattern 7w1, 7p, and 7c may be sequentially patterned using the second PR pattern 27 as an etch mask to expose a top surface of the conductive layer 5 through the first to third openings O1, O2, and O3. As the result of the patterning, the end portions of the first mask line portion 7w1 exposed by the third opening O3 may be cut. This means that the first mask line portion 7w1 may not preserve the closed curve shape and form a plurality of first mask line portions 7w1 separated from each other. The second mask line portion 9w1 and the first mask line portion 7w1 thereunder may be cut to form a second dummy mask line portion 9d and a first dummy mask line portion 7d.

Figure 12A:
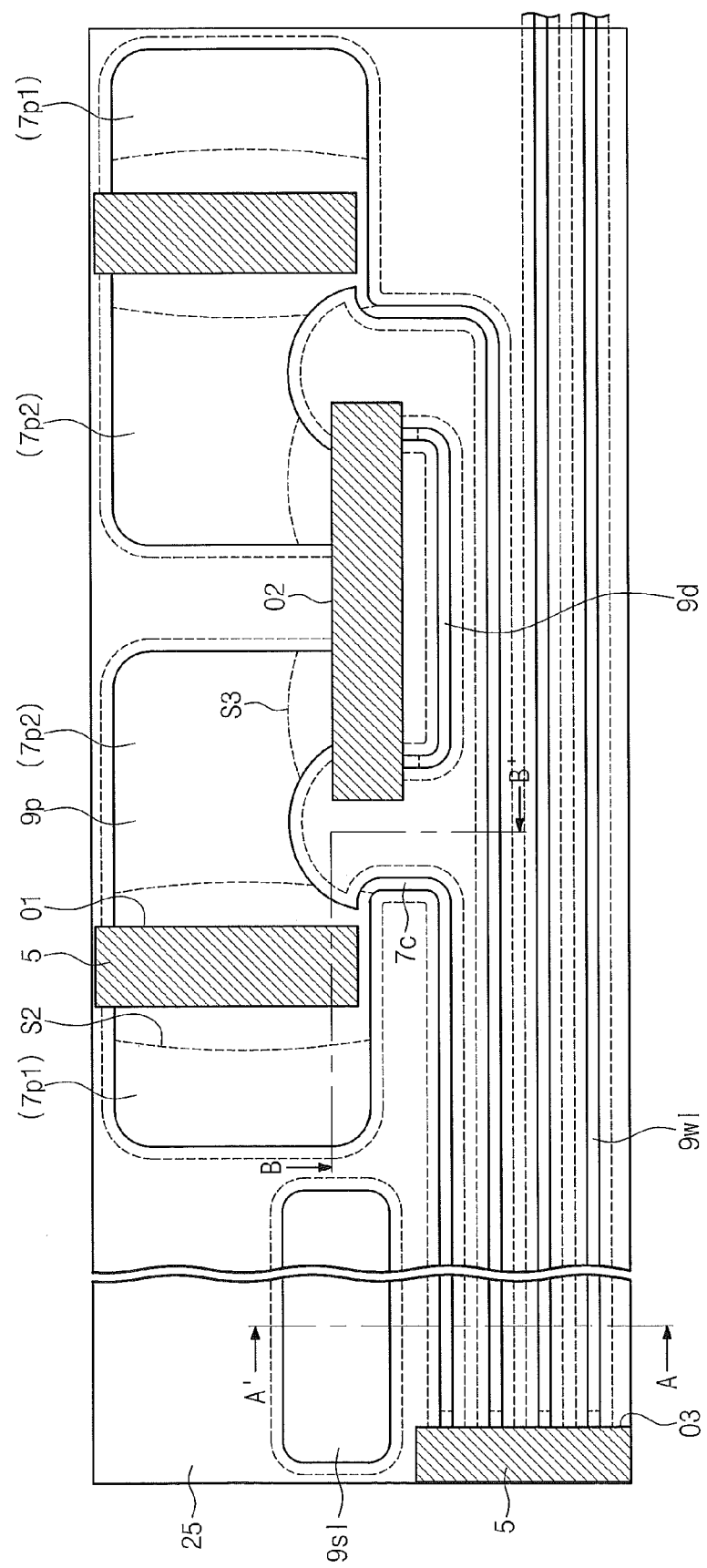
Figure 12B:
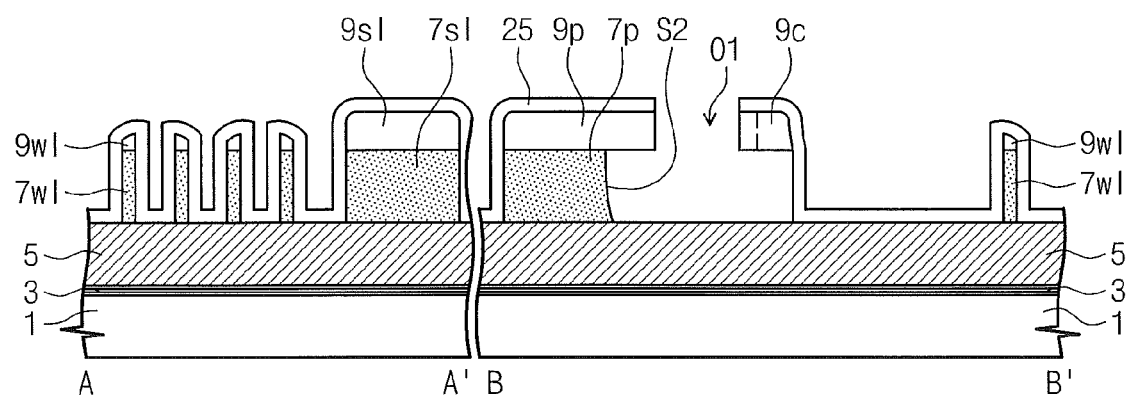

Referring to FIGS. 12A and 12B, the second PR pattern 27 may be selectively removed to expose the second spacer layer 25. An isotropic etching process may be performed to remove portions of the first WL mask pattern 7w1, 7p, and 7c exposed by the first to third openings O1, O2, and O3. Accordingly, below the second mask pad portion 9p, the first mask preliminary pad portion 7p may be divided into two first mask pad portions 7p1 and 7p2. As the result of the isotropic etching process, the first mask pad portions 7p1 and 7p2 may have second and third sidewalls S2 and S3 having a concave profile. Furthermore, the first mask connecting portion 7c may be partially removed to expose an inner sidewall of the first spacer layer 25. Bottom surfaces of the second mask pad portion 9p and the second mask connecting portion 9c may be partially exposed.

Figure 13A:
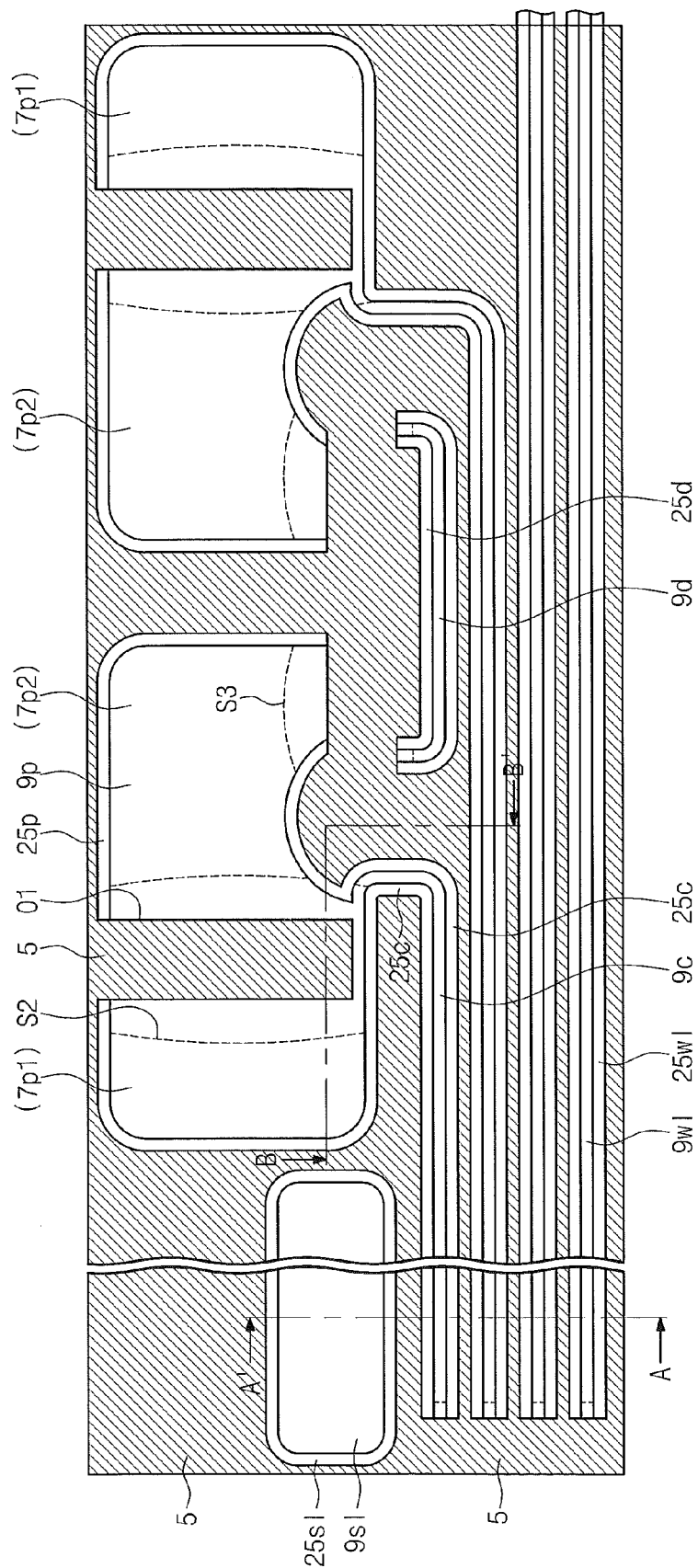
Figure 13B:
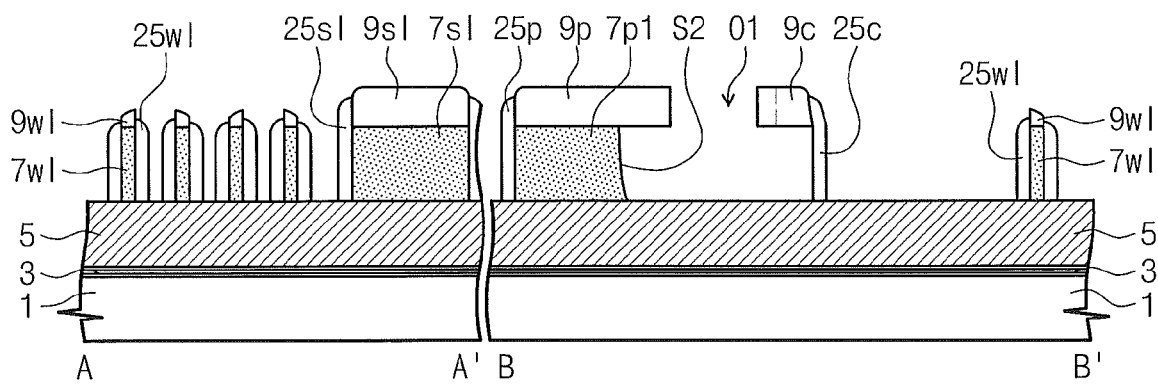

Referring to FIGS. 13A and 13B, an anisotropic etching process may be performed to the second spacer layer 25 to form second spacers 25s1, 25w1, 25p, 25c, and 25d and expose the conductive layer 5. The second spacers 25s1, 25w1, 25p, 25c, and 25d may include a second SL spacer 25s1, a second line spacer 25w1, a second pad spacer 25p, a second connection spacer 25c, and a second dummy spacer 25d that cover sidewalls of the first SL mask pattern 7s1, the first mask line portion 7w1, the first mask pad portion 7p1 and 7p2, the first mask connecting portion 7c, and the first dummy mask line portion 7d.

Figure 14A:
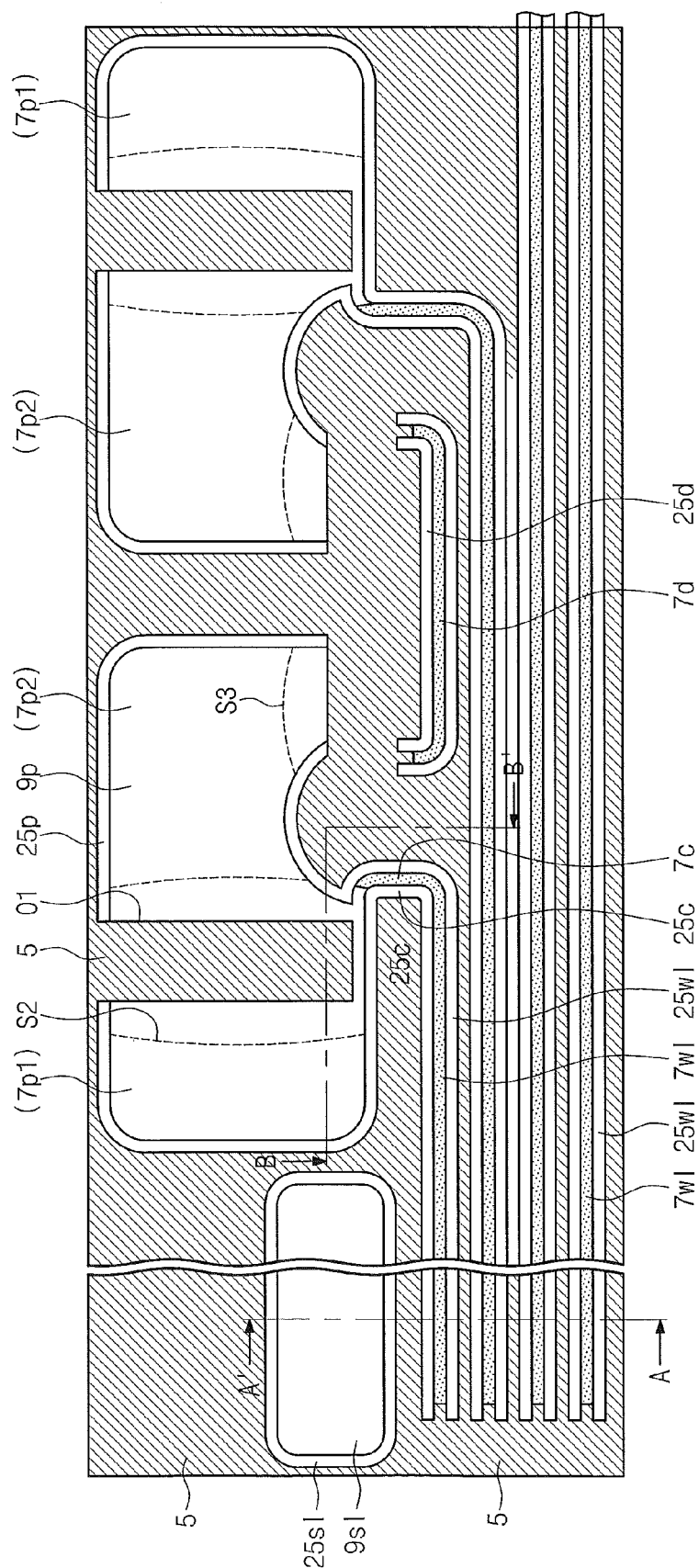
Figure 14B:
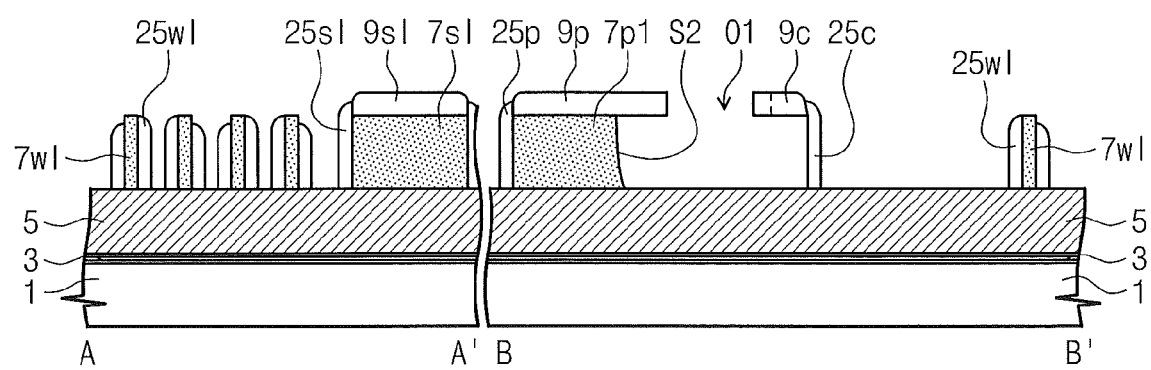

Referring to FIGS. 14A and 14B, the second mask line portion 9w1, the second dummy mask line portion 9d, and the second mask connecting portion 9c may be removed to expose the top surfaces of the first mask line portion 7w1, the first dummy mask line portion 7d, and the first mask connecting portion 7c. In some embodiments, since the second SL mask pattern 9s1, the second mask pad portion, and the connecting portion 9p and 9c have thicknesses that are greater than those of the second mask line portions 9w1 and 9d, the second SL mask pattern 9s1, the second mask pad portion, and the connecting portion 9p and 9c may remain.

Figure 15A:
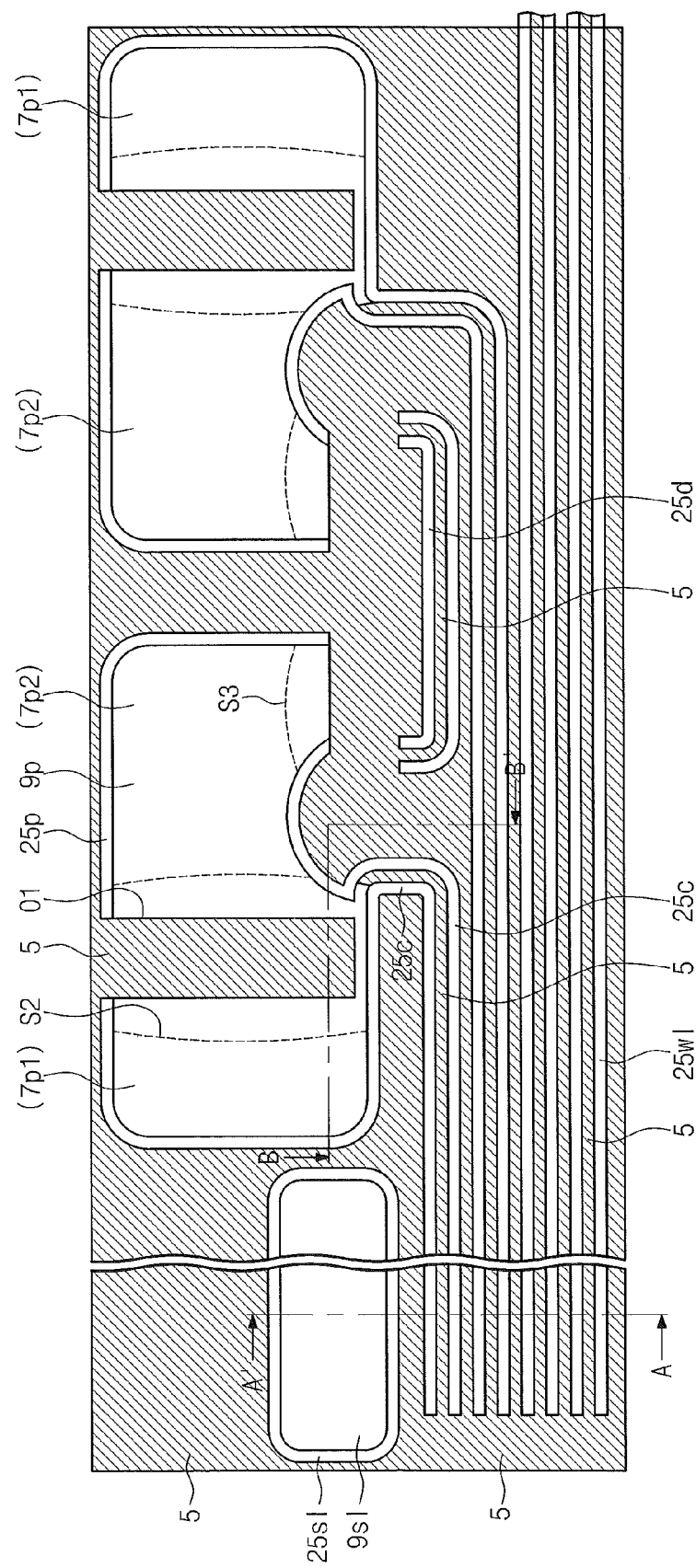
Figure 15B:
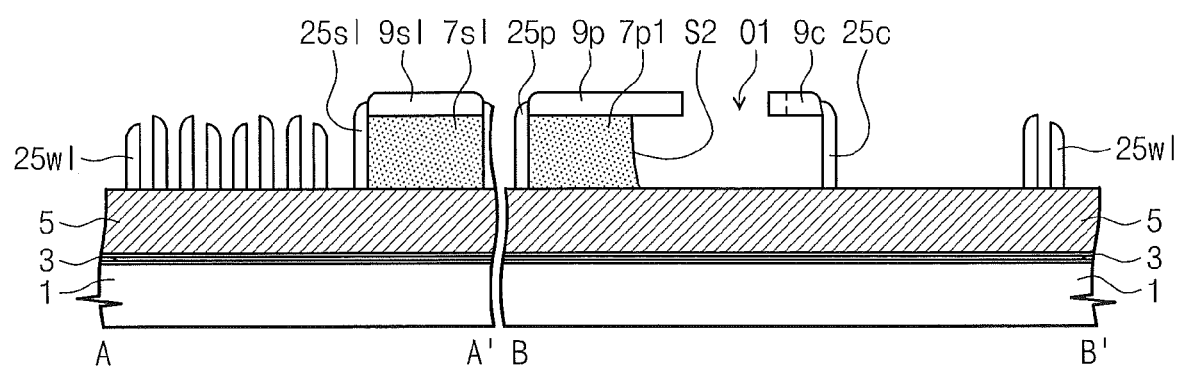

Referring to FIGS. 15A and 15B, the first mask line portion 7w1, the first dummy mask line portion 7d, and the first mask connecting portion 7c may be removed to expose the conductive layer 5 thereunder. In these embodiments, top surfaces of the first SL mask pattern 7s1 and the first mask pad portions 7p1 and 7p2 may not be removed because they are covered with the second mask pattern 9s1 and 9p.

Figure 16A:
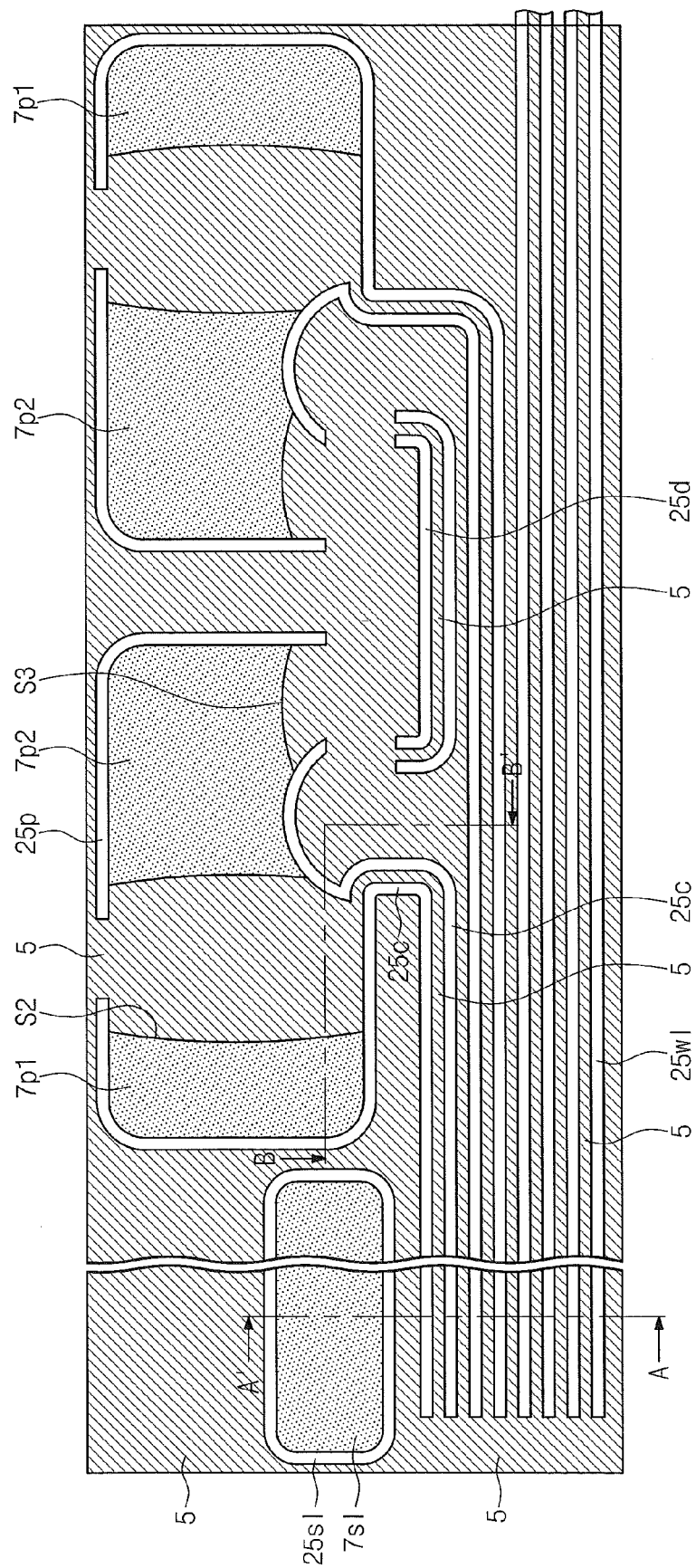
Figure 16B:
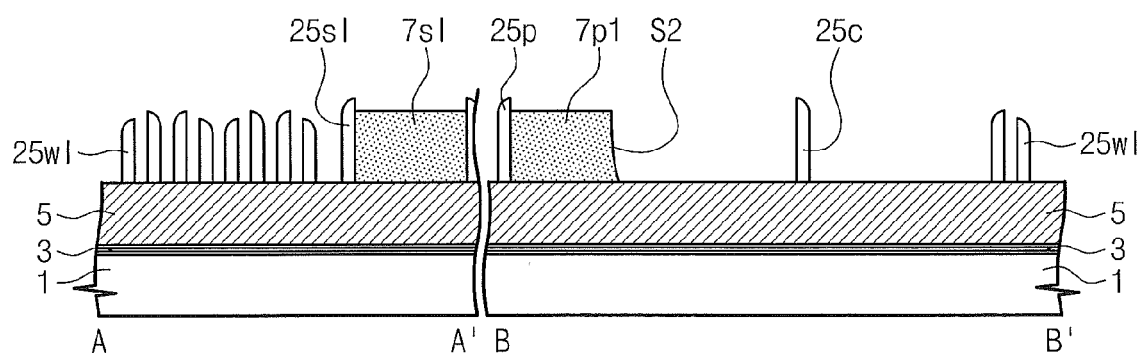

Referring to FIGS. 16A and 16B, the second mask pattern 9s1 and 9p may be selectively removed to expose the first mask pattern 7s1, 7p1, and 7p2 thereunder.

Figure 17A:
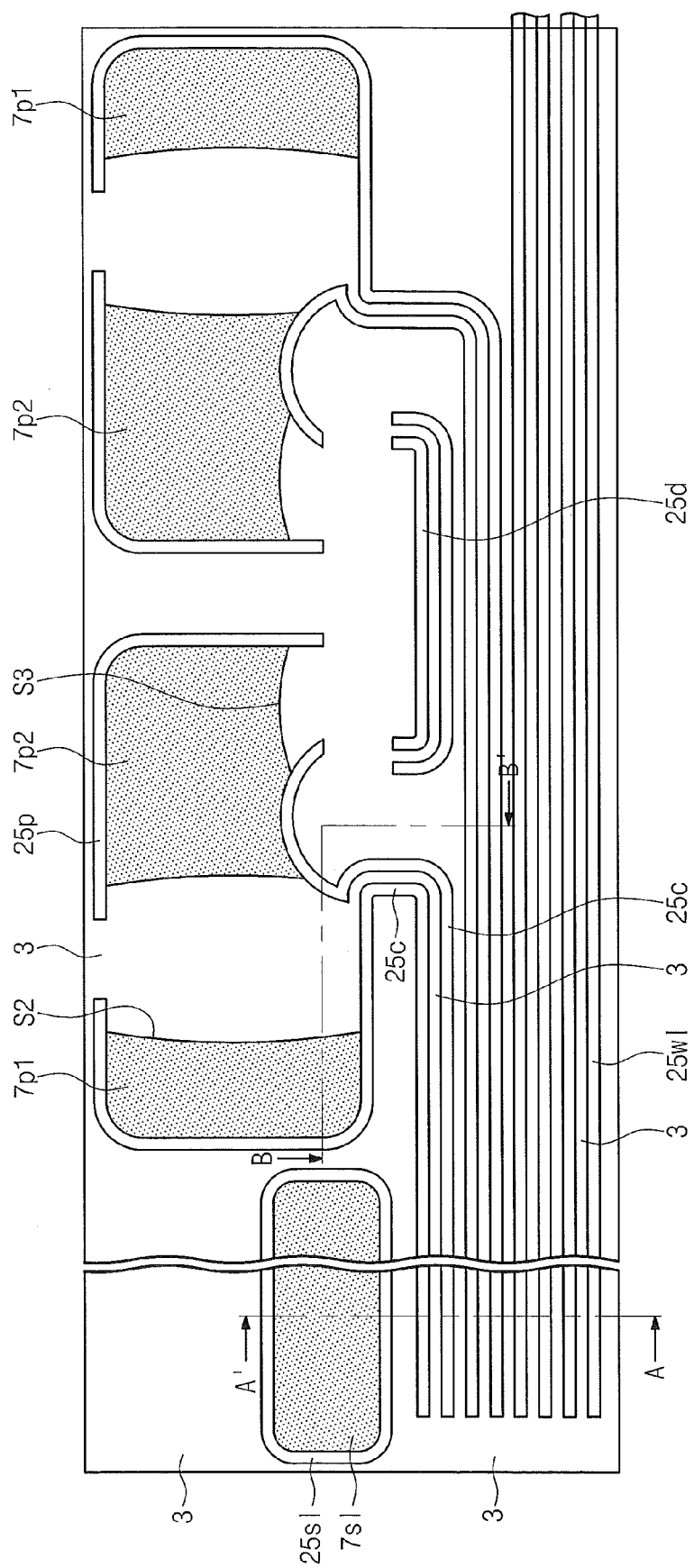
Figure 17B:
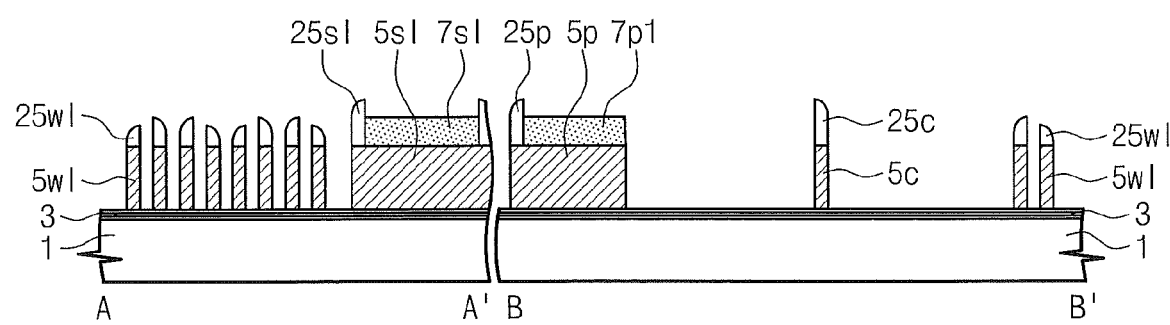

Referring to FIGS. 17A and 17B, the conductive layer 5 may be etched using the second spacers 25s1, 25w1, 25p, 25c, and 25d and the first mask pattern 7s1, 7p1, and 7p2 as an etch mask to form conductive patterns 5s1, 5w1, 5p, 5c, and 5d. When viewed from above, the conductive patterns 5s1, 5w1, 5p, 5c, and 5d may have shapes corresponding to those of the second spacers 25s1, 25w1, 25p, 25c, and 25d and the first mask pattern 7s1, 7p1, and 7p2. Each of the conductive patterns 5s1, 5w1, 5p1, 5p2, 5c, and 5d may include a selection line 5s1, a word line 5w1, 5p, and 5c, and a dummy line 5d. Here, similar to the connecting portion 5c covered with the second connection spacer 25c, the dummy line 5d may be disposed below or covered with the second dummy spacer 25d.

The word line 5w1, 5p1, 5p2, and 5c may include a line portion 5w1, a pad portion 5p1 and 5p2, and a connecting portion 5c. As a result, four WL line portions 5w1 may be formed from one first PR line portion pattern 21w1 of FIG. 1A. In other words, by performing two photolithography processes and two spacer processes, patterns can be formed to have a pitch that is smaller than a limitation of photolithography process. In addition, since the line portion and the pad portion are simultaneously defined by performing the photolithography process once, there is no necessity to perform an additional photolithography process for forming the pad portion. Accordingly, it is possible to overcome technical problems, such as mask misalignment or bridge.

Figure 18A:
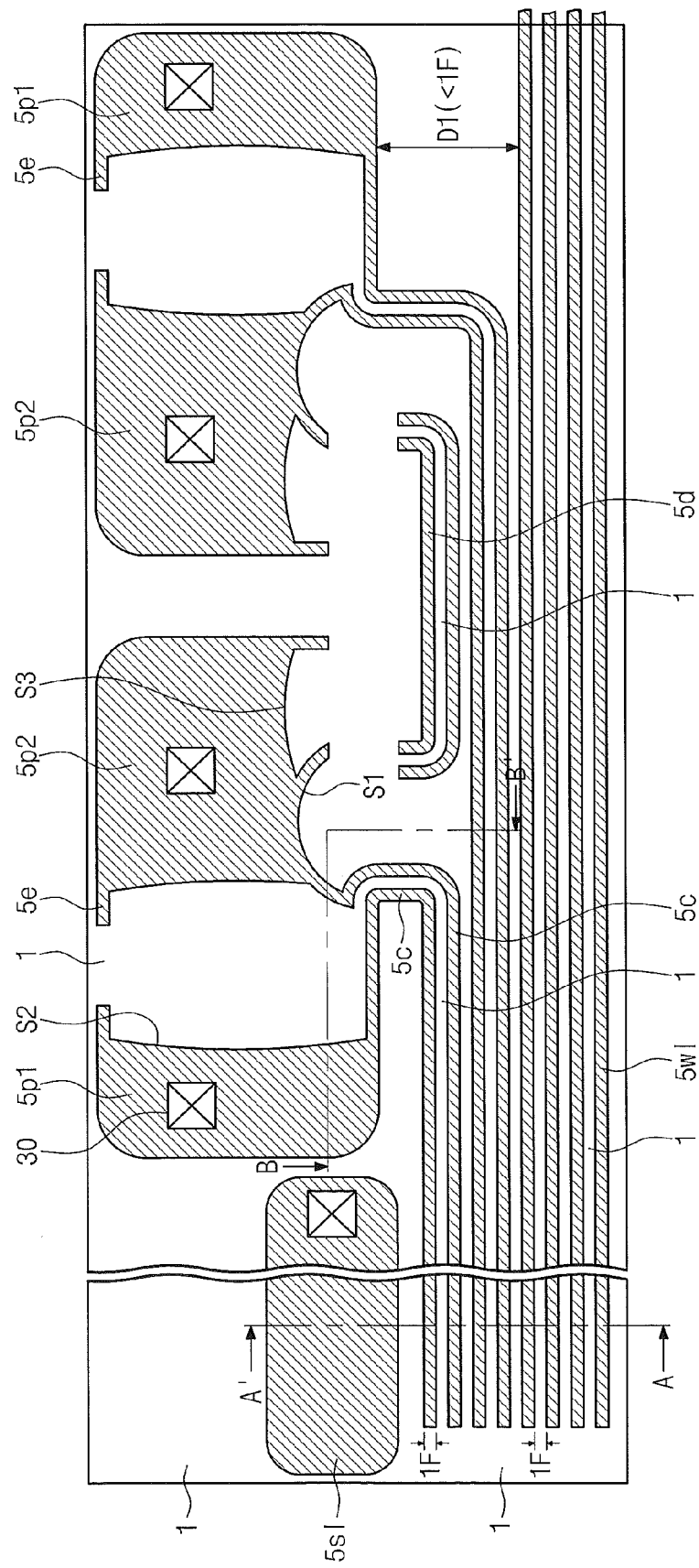
Figure 18B:
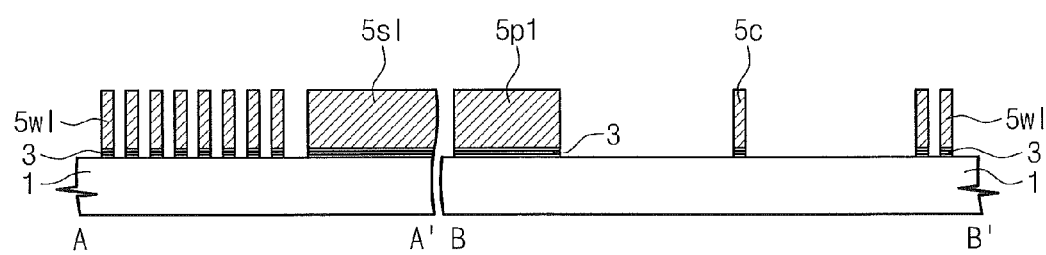

Referring to FIGS. 18A and 18B, the gate insulating layer 3 may be etched using the second spacers 25s1, 25w1, 25p, 25c, and 25d and the first mask pattern 7s1, 7p1, and 7p2 as an etch mask to expose the substrate 1. Thereafter, as illustrated in FIG. 18A, contacts 30 may be formed on an end portion of the selection line 5s1 and on the pad portions 5p1 and 5p2, respectively.

According to some embodiments of the inventive concept, the method of fabricating a semiconductor device may include performing a photolithography process once to form the fourth mask pattern, and then, performing two spacer forming processes using the fourth mask pattern to form spacers, which will be used to etch an etch-target layer. Accordingly, it is possible to form patterns having a pitch that is smaller than a limitation of photolithography process.

Referring again to FIGS. 18A and 18B, the semiconductor device may include the selection line 5s1, the word line 5w1, 5c, 5p1, and 5p2, and the dummy word line 5d that are provided on the substrate 1. In the NAND FLASH memory device, the selection line 5s1 may serve as the ground selection line or the string selection line. In some embodiments, the selection line 5s1 may serve as gate electrodes or interconnection lines of the peripheral circuit region. The word line 5w1, 5c, 5p1, and 5p2 may serve as the word line of the NAND FLASH memory device. In further embodiments, the word line 5w1, 5c, 5p1, and 5p2 may serve as bit lines of a vertical NAND device or MRAM, PRAM, or RRAM devices. The word line 5w1, 5c, 5p1, and 5p2 may include the line portion 5w1, the pad portion 5p1 and 5p2, and the connecting portion 5c. In some embodiments, a width of each line portion 5w1 may be 1 F, and a space between the line portions 5w1 may be 1 F. The pad portion 5p1 and 5p2 may include the first pad portion 5p1 and the second pad portion 5p2 that are separated from each other. The pad portion 5p1 and 5p2 may have a width that is greater than that of the line portions 5w1 and have at least one concave sidewall S1, S2, and/or S3. The pad portion 5p1 and 5p2 may include at least one extension 5e protruding from an end portion thereof. The extension 5e may have a width that is equivalent to the width, i.e., 1 F, of the line portion 5w1. The connecting portion 5c may be connected to or extend laterally from a side surface of the line portion 5w1. Accordingly, the connecting portion 5c may not be parallel to the line portion 5w1. A space D1 between the pad portion 5p1 or 5p2 of two adjacent word lines 5w1 may be greater than a space, i.e., 1 F, between two adjacent word lines 5w1. Two adjacent pairs, each of which is comprised of two adjacent pad portions 5p1 and 5p2, may be formed to have mirror symmetry with respect to the midpoint therebetween. For example, two adjacent second pad portions 5p2 may have mirror symmetry with respect to the midpoint, and two adjacent first pad portions 5p1 may have mirror symmetry with respect to the midpoint. The dummy word line 5d may be provided adjacent to a pair of the second pad portions 5p2 adjacent to each other.

FIGS. 19A through 21A are plan views illustrating processing steps in the fabrication of semiconductor devices according to some embodiments of the inventive concept. FIGS. 19B through 21B are cross-sections taken along lines A-A' and B-B' of FIGS. 19A through 21A, respectively.

Figure 19A:
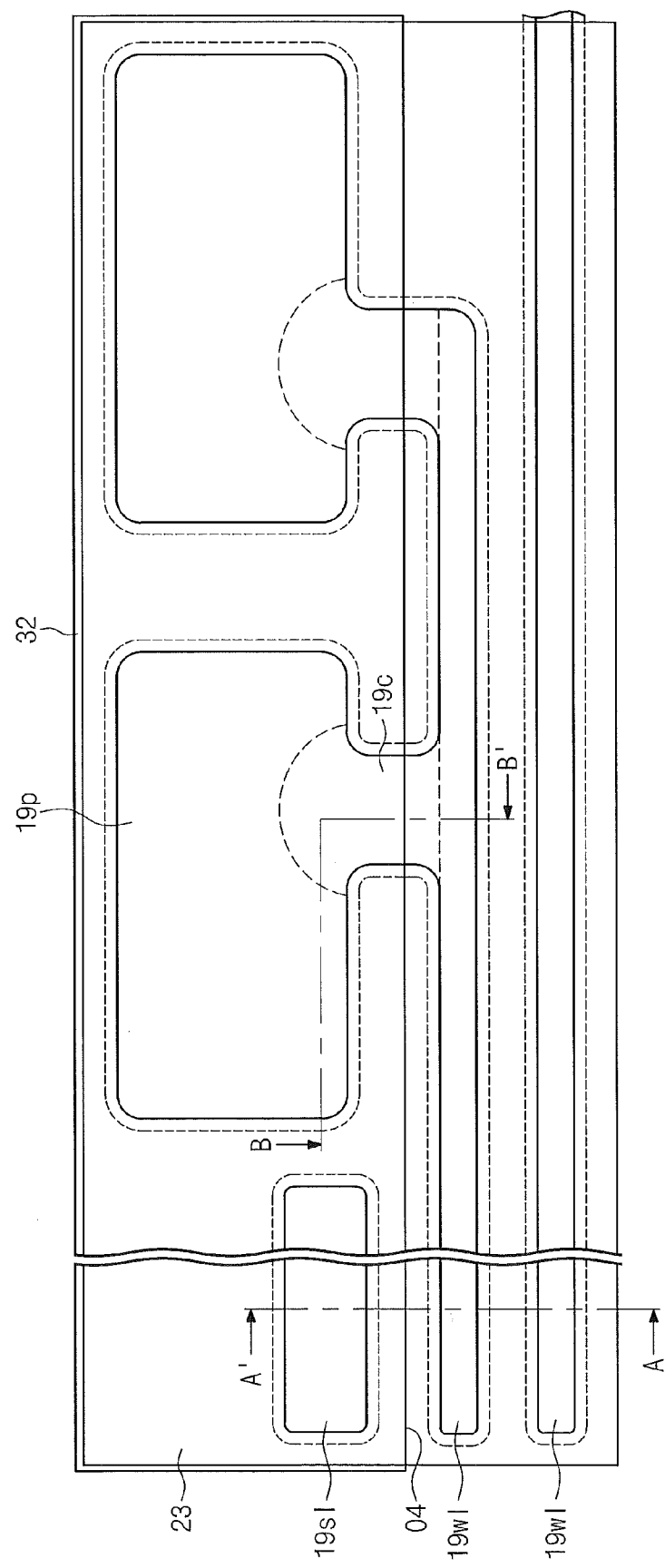
Figure 19B:
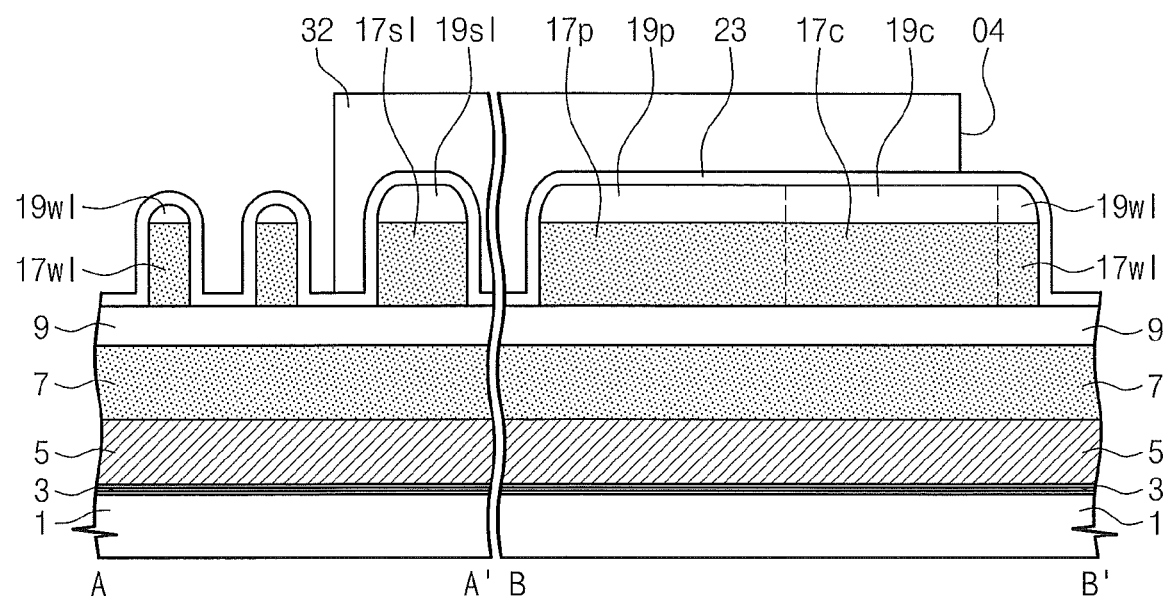

Referring to FIGS. 19A and 19B, a third PR pattern 32 may be formed on the structure of FIGS. 3A and 3B. For example, the third PR pattern 32 may be formed on the first spacer layer 23 to have a fourth opening O4. The fourth opening O4 may be formed to be overlapped with the fourth mask line portions 19w1.

Figure 20B:
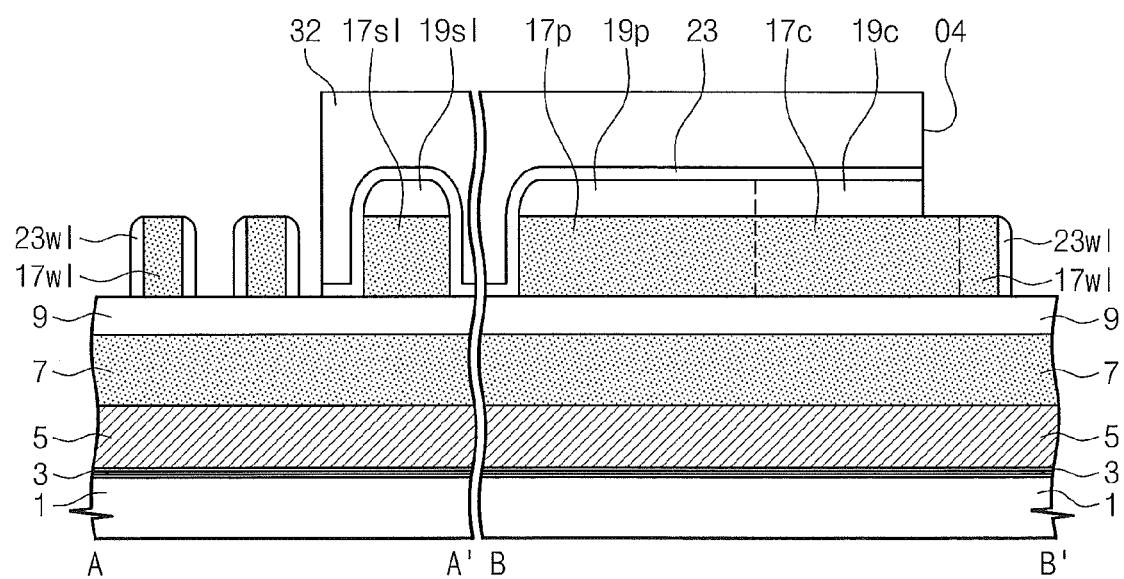

Referring to FIGS. 20A and 20B, an anisotropic etching process, in which the third PR pattern 32 is used as etch mask, may be performed to remove the first spacer layer 23 and the fourth mask line portions 19w1 from the top surface of the third mask line portions 17w1. Accordingly, the first line spacer 23w1 may be formed to cover the sidewalls of the third mask line portions 17w1 and expose the top surface of the third mask line portions 17w1.

Figure 21A:
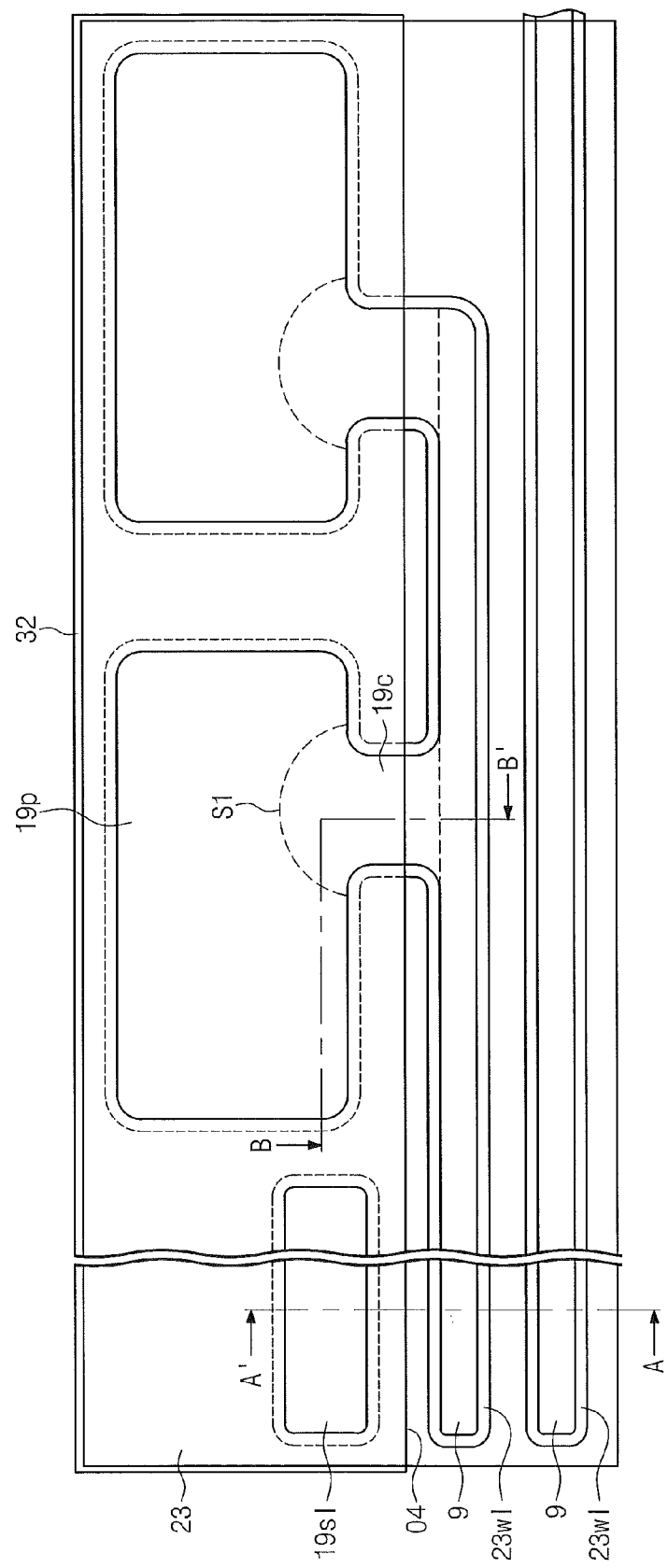
Figure 21B:
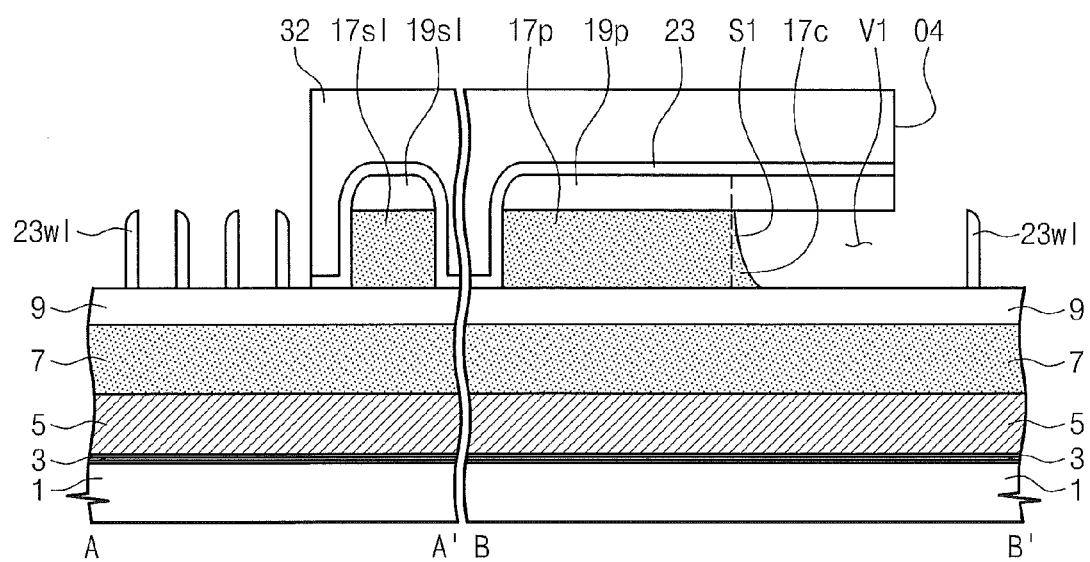

Referring to FIGS. 21A and 21B, an isotropic etching process may be performed to remove selectively the third mask line portions 17w1. As illustrated, a large portion of the third mask connecting portion 17c may be removed during this removing process.

The third PR pattern 32 may be removed, as illustrated in FIGS. 6A and 6B. Thereafter, the second mask layer 9 may be patterned using the first line spacer 23w1 and the third mask patterns 17s1, 17p, and 17c as etch mask to form the second mask patterns 9s1, 9w1, 9p, and 9c. In some embodiments, during the patterning of the third PR pattern 32, the first spacer layer 23 may be partially removed to form the first spacers 23s1, 23p, and 23c, and the fourth mask patterns 19s1, 19p, and 19c may be removed. The subsequent processes may be performed in the same manner as that of the previous embodiments.

FIGS. 22A through 24A and 25 through 28 are plan views illustrating processing steps in the fabrication of semiconductor devices according to some embodiments of the present inventive concept, and FIGS. 22B through 24B are cross-sections taken along lines A-A' and B-B' of FIGS. 22A through 24A, respectively.

Figure 22A:
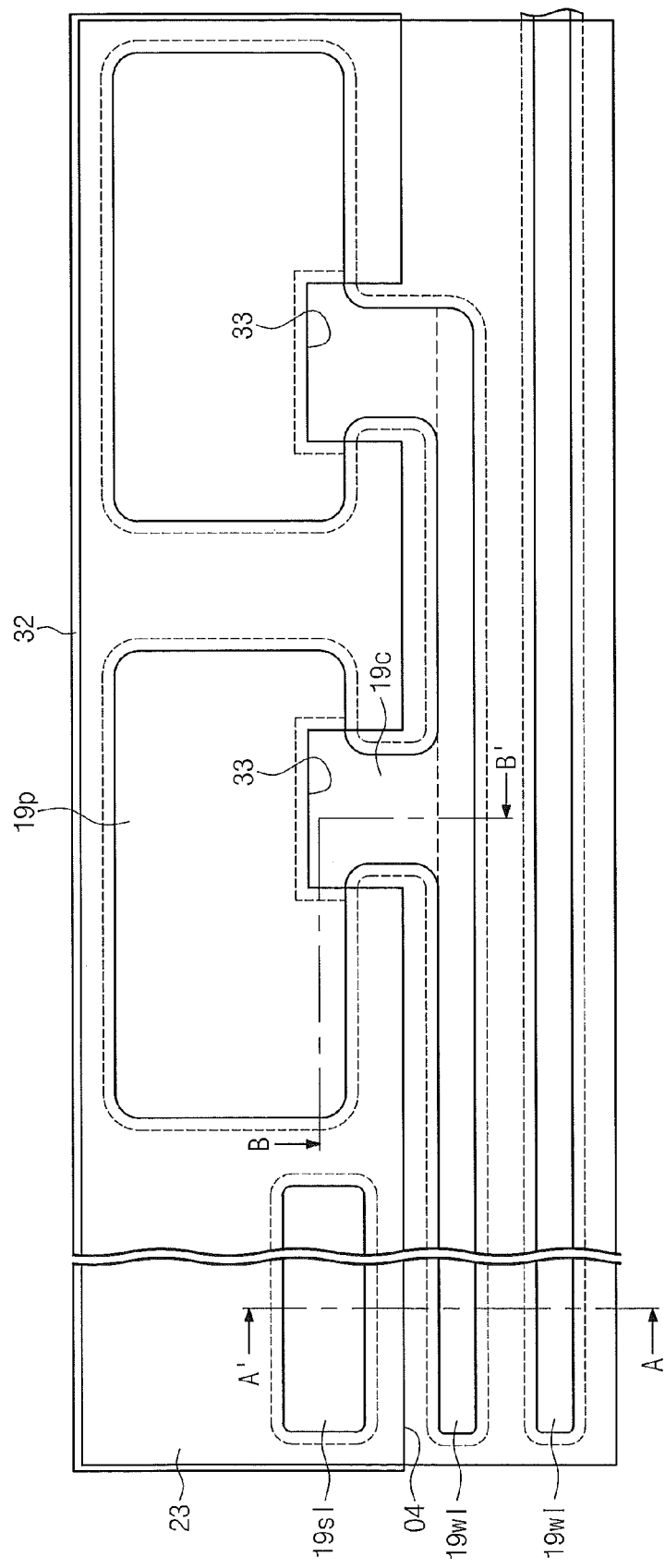
Figure 22B:
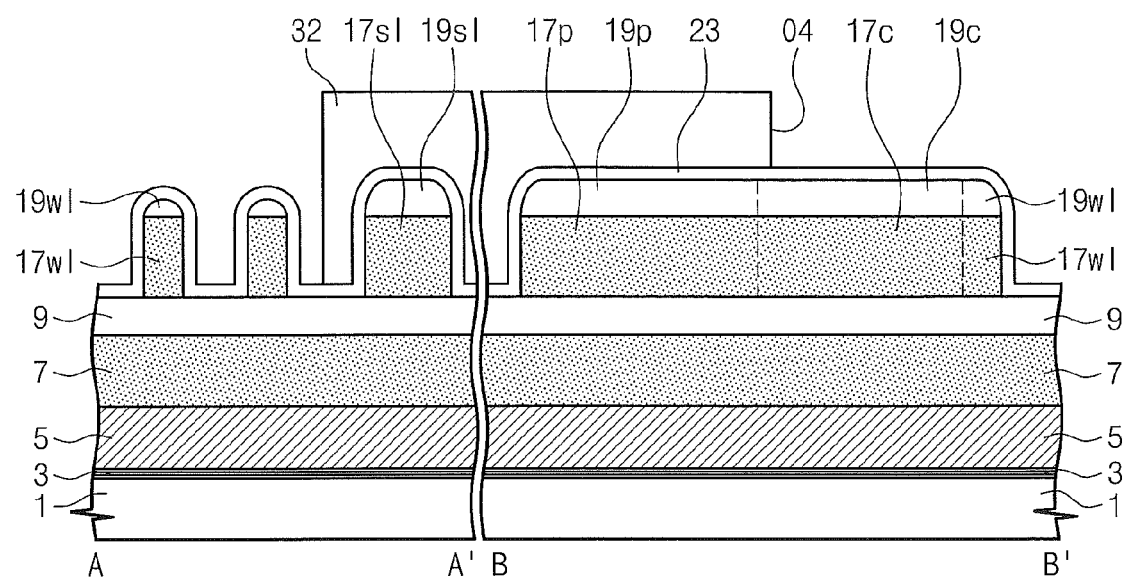

Referring to FIGS. 22A and 22B, a third PR pattern 32 with a fourth opening O4 may be formed on the first spacer layer 23 of FIGS. 3A and 3B. The fourth opening O4 may be formed to be overlapped with the fourth mask connecting portion 19c and the fourth mask line portions 19w1. Unlike the third PR pattern described with reference to FIGS. 19A and 19B, the third PR pattern 32 according to the present embodiments may further include a recessed opening 33. The recessed opening 33 may be formed to be overlapped with the fourth mask connecting portion 19c.

Figure 23A:
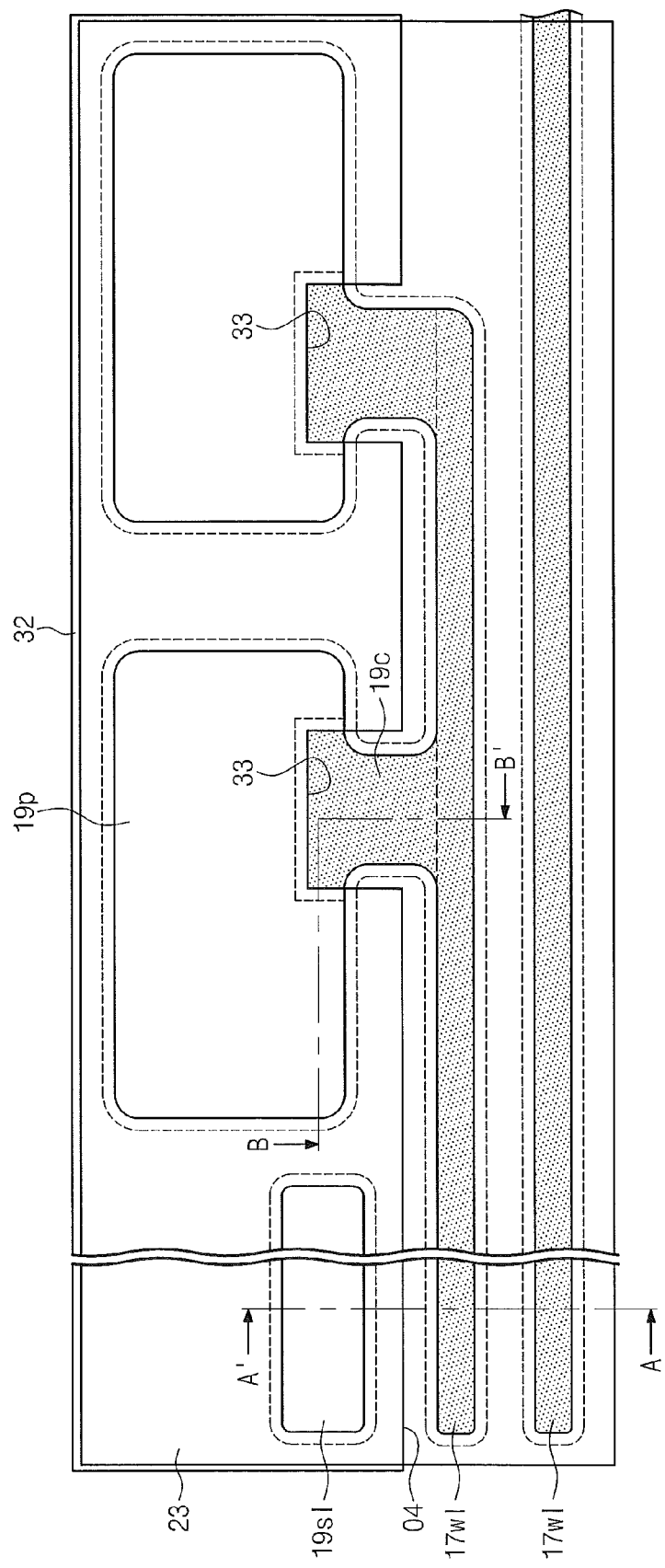
Figure 23B:
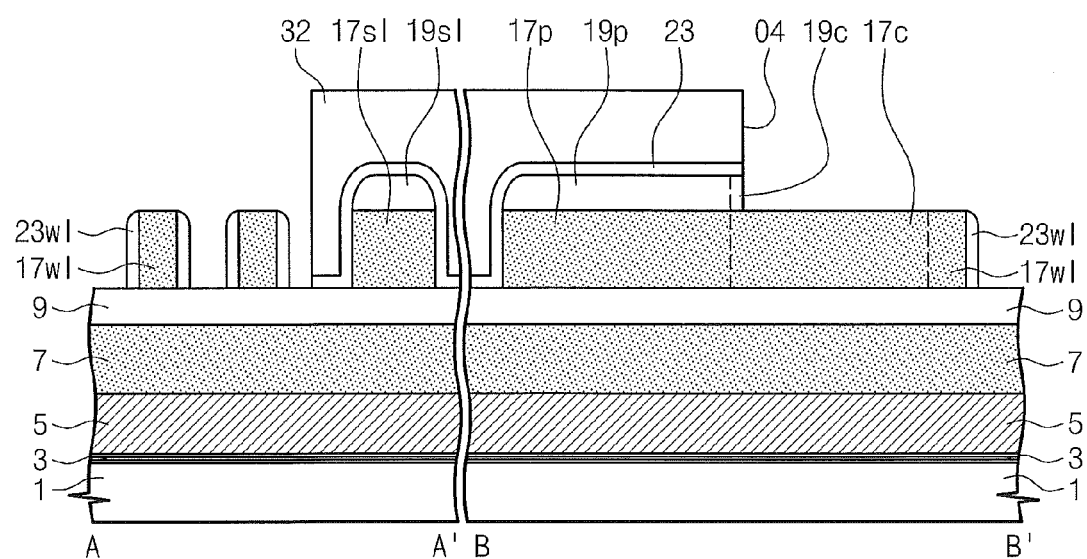

Referring to FIGS. 23A and 23B, an anisotropic etching process using the third PR pattern 32 as an etch mask may be performed to remove the first spacer layer 23 and the fourth mask line portions 19w1 from the top surfaces of the third mask line portions 17w1. In this process, first line spacers 23w1 may be formed to cover sidewalls of the third mask line portions 17w1. Furthermore, due to the presence of the recessed opening 33, the first spacer layer 23 and the fourth mask connecting portion 19c may also be removed from the top surface of the third mask connecting portion 17c. In other words, the top surfaces of the third mask connecting portion 17c and the third mask line portions 17w1 may be exposed.

Figure 24A:
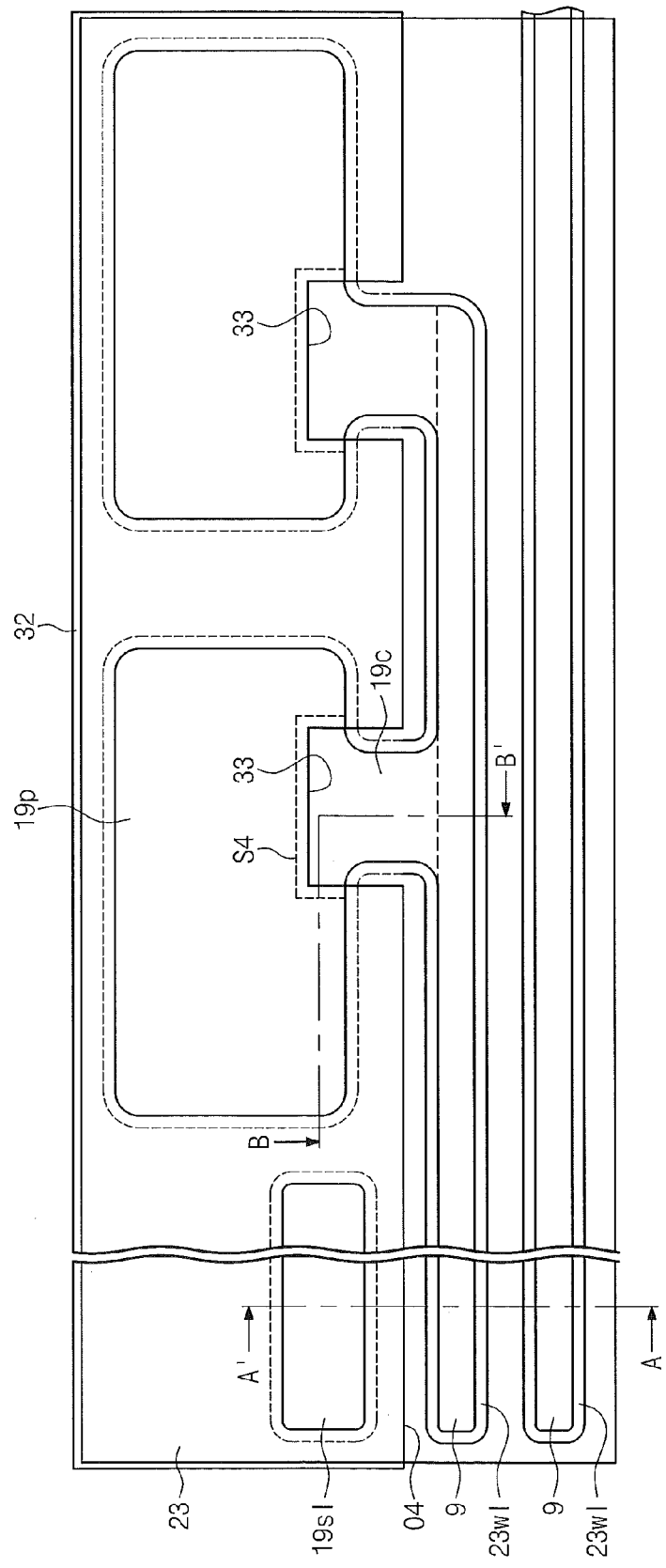
Figure 24B:
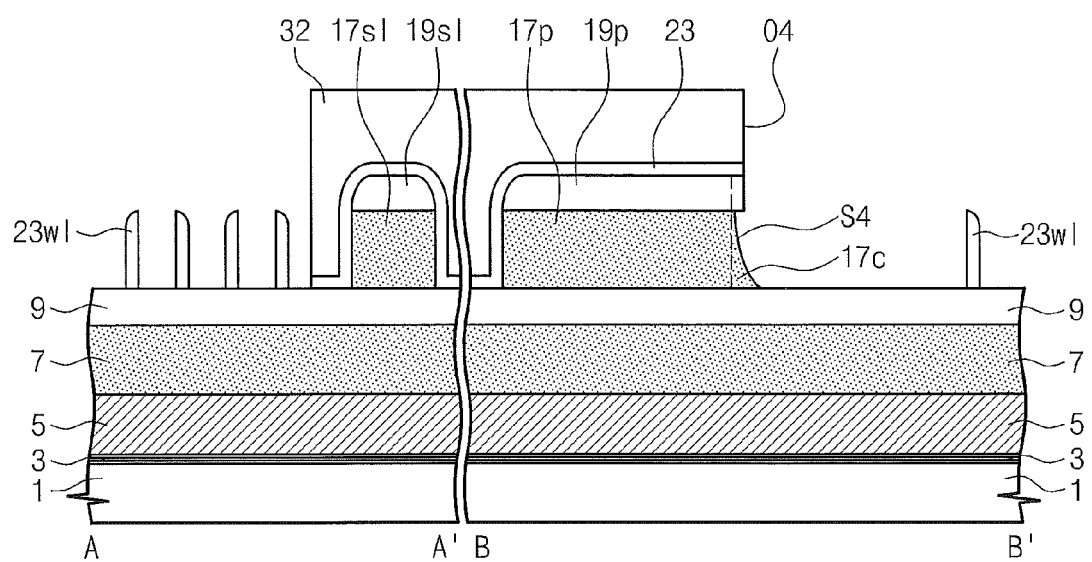

Referring to FIGS. 24A and 24B, an anisotropic etching process using the third PR pattern 32 as an etch mask may be performed to selectively remove the third mask line portions 17w1 exposed by the third PR pattern 32. Furthermore, the anisotropic etching process may be performed to remove a large portion of the third mask connecting portion 17c exposed by the third PR pattern 32. For example, the third mask connecting portion 17c may have a portion remaining after the anisotropic etching process and defining a line-shaped fourth sidewall S4 in a plan view. When viewed in a plan view, a shape of the fourth sidewall S4 may resemble that of the recessed opening 33 of the third PR pattern 32.

Figure 25:
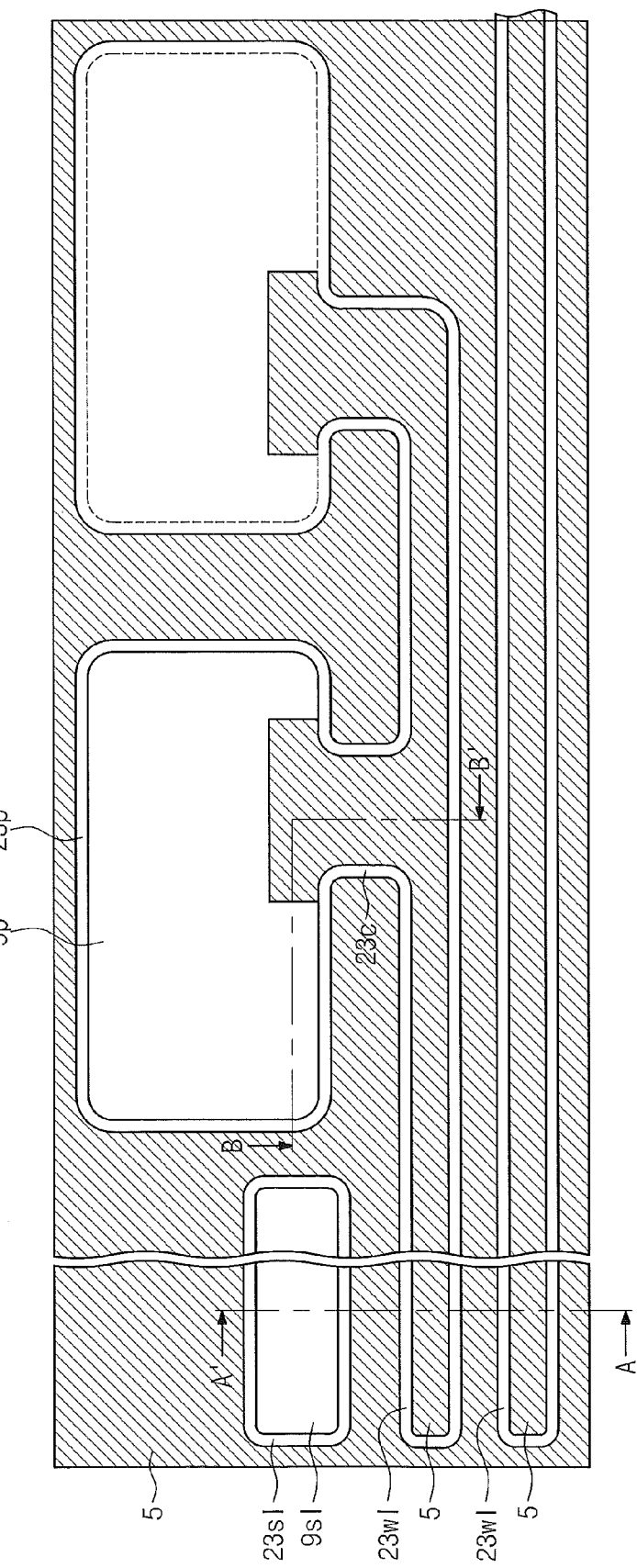

Referring to FIGS. 25 and 7B, the third PR pattern 32 may be removed. Thereafter, the second mask layer 9 may be patterned using the first line spacer 23w1 and the third mask patterns 17s1, 17p, and 17c as an etch mask to form the second mask patterns 9s1, 9w1, 9p, and 9c, as shown in FIGS. 6A and 6B.

The first mask layer 7 may be etched using the second mask patterns 9s1, 9w1, 9p, and 9c as an etch mask to form first mask patterns 7s1, 7w1, 7p, and 7c. The conductive layer 5 may be exposed as the result of the etching process. In certain embodiments, the first mask patterns 7s1, 7w1, 7p, and 7c may be formed using the same method as that for forming the first mask patterns described with reference to FIGS. 7A and 7B.

Figure 26:
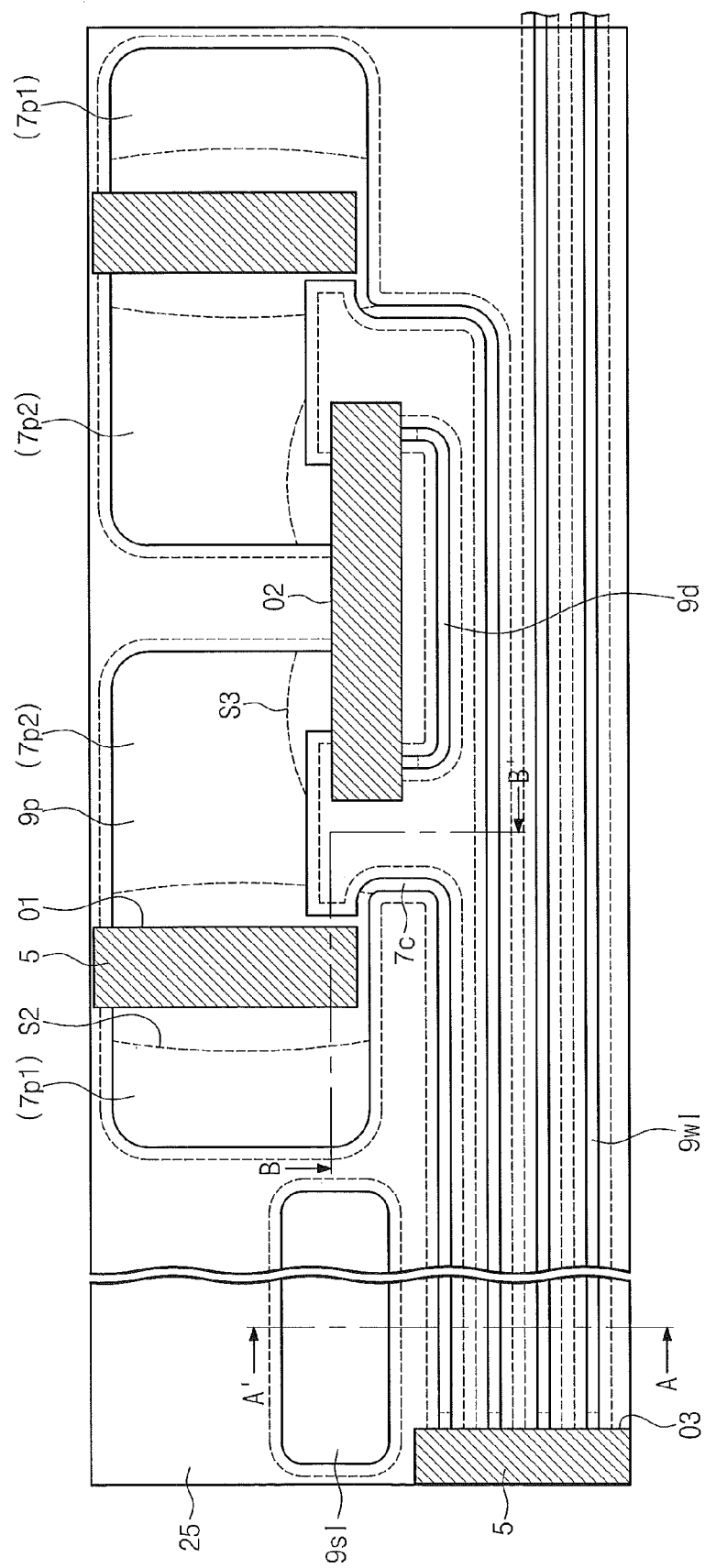

Referring to FIGS. 26 and 12B, the remaining portions of the first spacers 23s1, 23w1, 23p, and 23c may be removed (for example, see FIGS. 8A and 8B). A second spacer layer 25 may be conformally formed on the substrate 1, as shown in FIGS. 9A and 9B. Thereafter, a second photoresist pattern 27 with first to third openings O1, O2, and O3 may be formed on the second spacer layer 25, as shown in FIGS. 10A and 10B. The second spacer layer 25, the second word line mask pattern 9w1, 9p, and 9c, and the first word line mask pattern 7w1, 7p, and 7c may be sequentially patterned using the second photoresist pattern 27 as an etch mask to expose the top surface of the conductive layer 5 through the first to third openings O1, O2, and O3, as shown in FIGS. 11A and 11B.

The second photoresist pattern 27 may be selectively removed to expose the second spacer layer 25. Thereafter, an isotropic etching process may be performed to partially remove the first word line mask pattern 7w1, 7p, and 7c exposed by the first to third openings O1, O2, and O3. As a result, below the second mask pad portion 9p, the first mask preliminary pad portion 7p may be divided into two first mask pad portions 7p1 and 7p2. The selective removal of the second photoresist pattern 27 and the partial removal of the first word line mask pattern 7w1, 7p, and 7c may be performed using the same method as that described with reference to FIGS. 12A and 12B.

Figure 27:
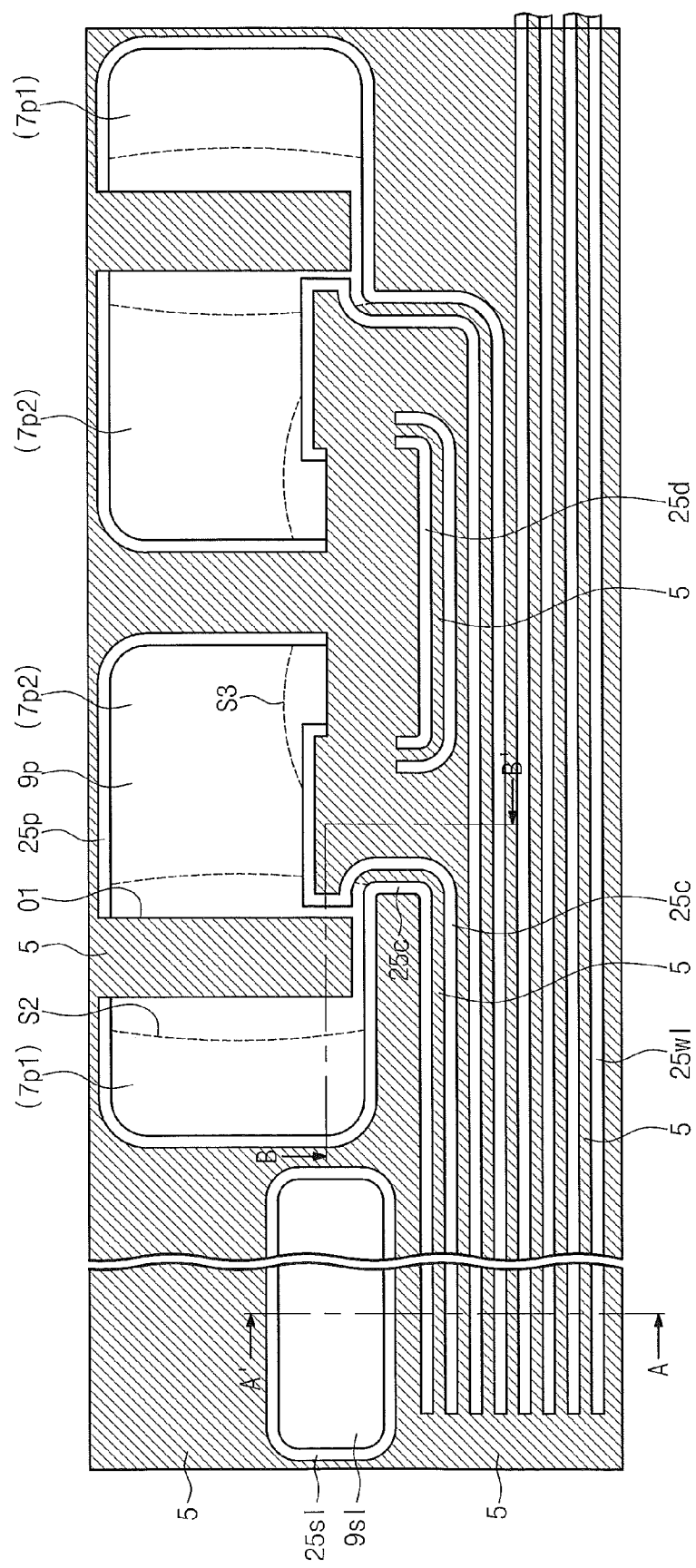

Referring to FIGS. 27 and 15B, the second spacer layer 25 may be anisotropically etched to form second spacers 25s1, 25w1, 25p, 25c, and 25d. The conductive layer 5 may be removed as the result of the etching process, as shown in FIGS. 13A and 13B. The second mask line portion 9w1, the second dummy mask line portion 9d, and the second mask connecting portion 9c may be removed to expose top surfaces of the first mask line portion 7w1, the first dummy mask line portion 7d, and the first mask connecting portion 7c, as shown in FIGS. 14A and 14B.

The first mask line portion 7w1, the first dummy mask line portion 7d, and the first mask connecting portion 7c, which are removed by the above etching process, may be removed to expose portions of the conductive layer 5. The removal of the first mask line portion 7w1, the first dummy mask line portion 7d, and the first mask connecting portion 7c may be performed using the same method as that described with reference to FIGS. 15A and 15B.

Figure 28:
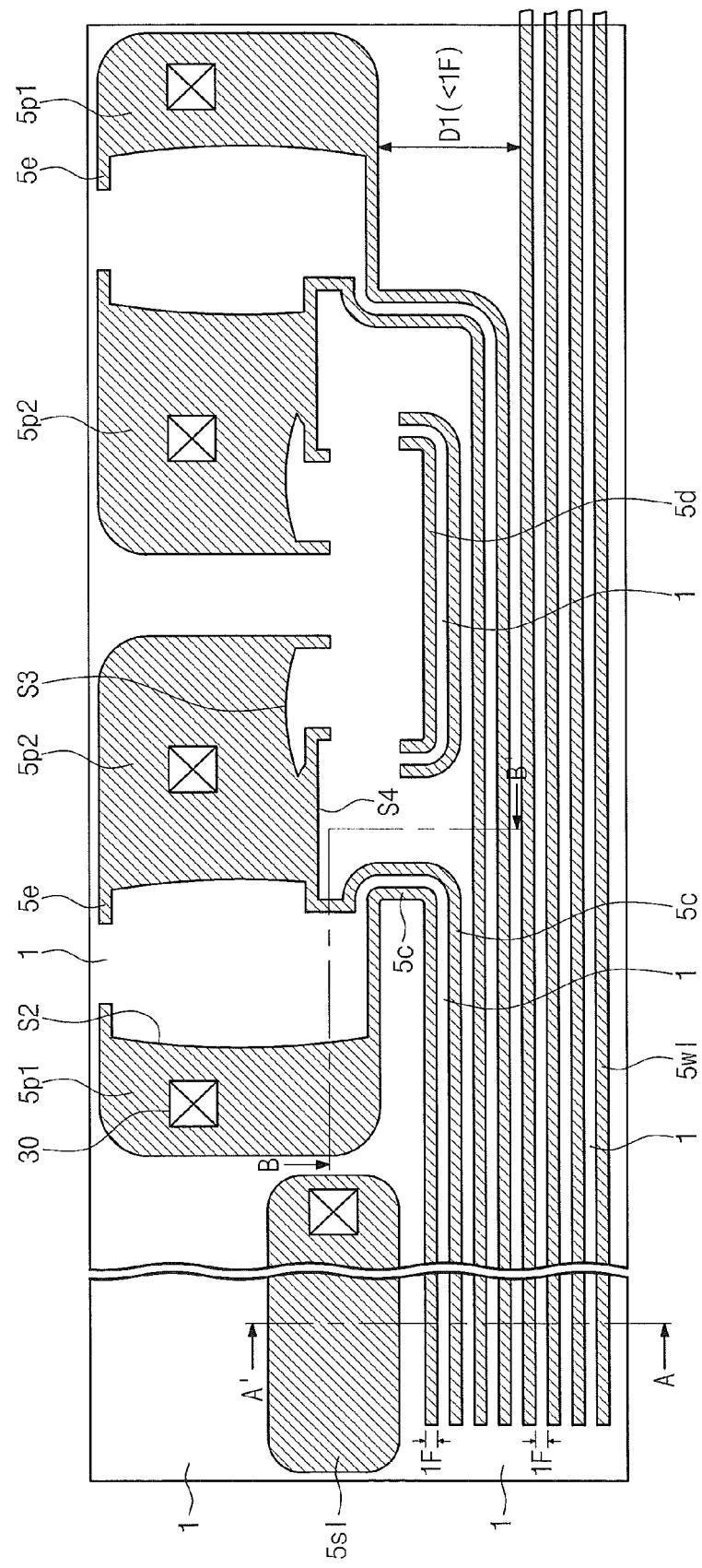

Referring to FIGS. 28 and 18B, the remaining portion of the second mask pattern 9s1 and 9p may be selectively removed to expose the first mask pattern 7s1, 7p1, and 7p2 thereunder, as shown in FIGS. 16A and 16B. The conductive layer 5 may be etched using the second spacers 25s1, 25w1, 25p, 25c, and 25d and the first mask pattern 7s1, 7p1, and 7p2 as an etch mask to form conductive patterns 5s1, 5w1, 5p, 5c, and 5d, as shown in FIGS. 17A and 17B.

The gate insulating layer 3 may be patterned using the second spacers 25s1, 25w1, 25p, 25c, and 25d and the first mask pattern 7s1, 7p1, and 7p2 as an etch mask to expose portions of the substrate 1. Thereafter, contacts 30 may be formed on an end portion of the selection line 5s1 and on the pad portions 5p1 and 5p2.

The semiconductor device of FIGS. 28 and 18B may include the selection line 5s1, the word line 5w1, 5c, 5p1, and 5p2, and the dummy word line 5d provided on the substrate 1. Similar to the connecting portion 5c covered with the second connection spacer 25c, the dummy word line 5d may be disposed below or covered with the second dummy spacer 25d. The word line 5w1, 5c, 5p1, and 5p2 may include the line portion 5w1, the pad portions 5p1 and 5p2, and the connecting portion 5c. The pad portions 5p1 and 5p2 may include the first pad portion 5p1 and the second pad portion 5p2 disposed spaced apart from each other. Each of the pad portions 5p1 and 5p2 may have a width greater than that of the line portion 5w1 and may be provided to have at least one concave sidewall S2 or S3. At least one of the pad portions 5p1 and 5p2 may have a fourth sidewall S4, which may be disposed between and adjacent to the concave sidewalls S2 and S3. When viewed in plan view, the fourth sidewall S4 may have a linear shape, unlike the concave sidewalls S2 and S3. Except for these differences, the selection line 5s1, the word line 5w1, 5c, 5p1, and 5p2, and the dummy word line 5d may be configured to have substantially the same features as those described with reference to FIGS. 18A and 18B.

Figure 29:
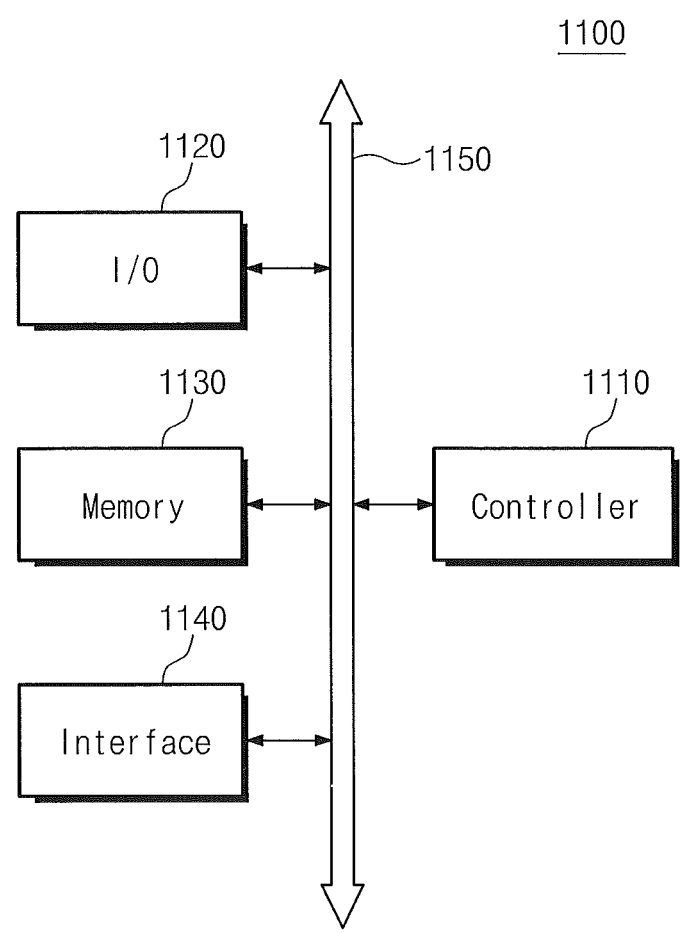
FIG. 29 is a schematic block diagram illustrating an example of memory systems including semiconductor devices according to some embodiments of the present inventive concept.

FIG. 29 is a schematic block diagram illustrating an example of memory systems including a semiconductor device according to some embodiments of the inventive concept. As illustrated in FIG. 29, a memory system 1100 can be applied to, for example, a personal digital assistant (PDA), a portable computer, a web tablet, a wireless phone, a mobile phone, a digital music player, a memory card and/or all the devices that can transmit and/or receive data in a wireless communication environment.

The memory system 1100 may include a controller 1110, an input/output device 1120, for example, a keypad and a display device, a memory 1130, an interface 1140, and a bus 1150. The memory 1130 and the interface 1140 communicate with each other through the bus 1150.

The controller 1110 may include at least one microprocessor, at least one digital signal processor, at least one micro controller or other process devices similar to the microprocessor, the digital signal processor, and the micro controller. The memory 1130 may be used to store an instruction executed by the controller 1110. The input/output device 1120 may receive data or a signal from the outside of the system 1100 or transmit data or a signal to the outside of the system 1100. For example, the input/output device 1120 may include a keyboard, a keypad and/or a displayer.

The memory 1130 includes at least one of the nonvolatile memory devices according to some embodiments of the inventive concepts. The memory 1130 may further include a different kind of memory, a volatile memory device capable of random access and various kinds of memories.

The interface 1140 transmits data to a communication network or receives data from a communication network.

Figure 30:
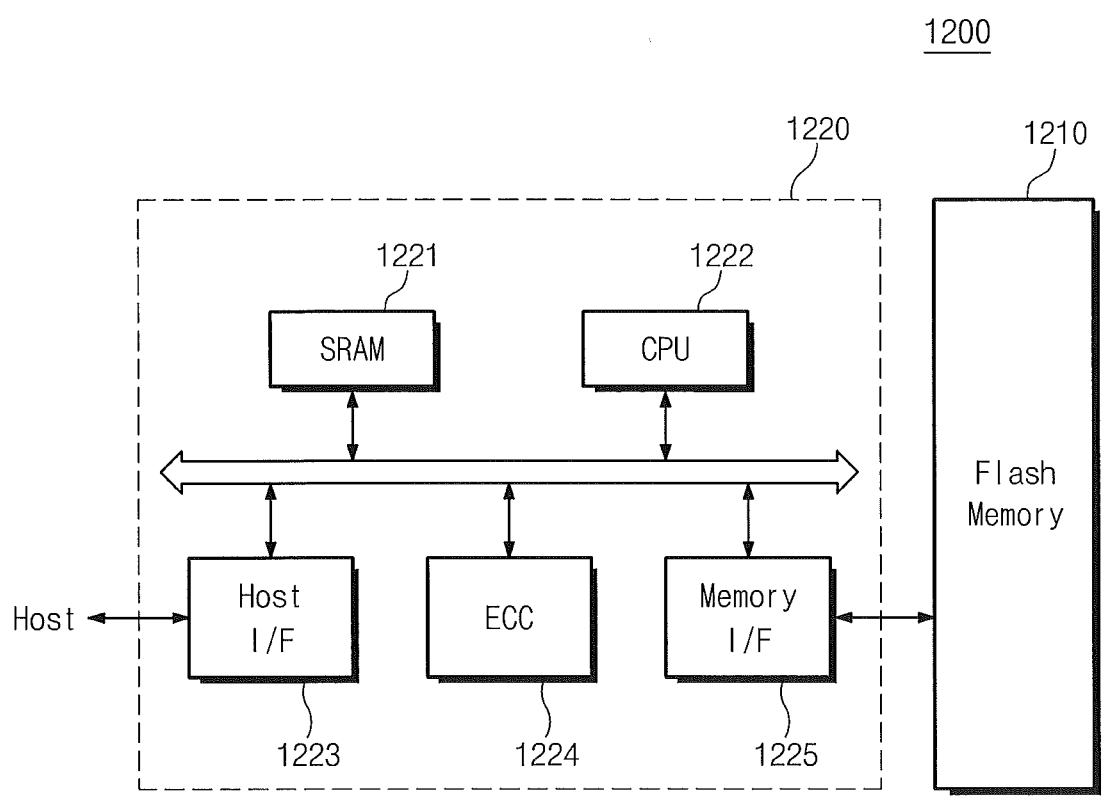
FIG. 30 is a schematic block diagram illustrating an example of memory cards including semiconductor devices according to some embodiments of the present inventive concept.

FIG. 30 is a schematic block diagram illustrating an example of memory cards including a semiconductor device according to some embodiments of the inventive concept. As illustrated in FIG. 30, the memory card 1200 for supporting a storage capability of a large capacity is fitted with a semiconductor memory device 1210, which may be the nonvolatile memory devices according to some embodiments of the inventive concepts. The memory card 1200 includes a memory controller 1220 controlling every data exchange between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. The memory card 1200 according to some embodiments of the inventive concepts may further include a ROM storing code data for interfacing with the host.

The semiconductor memory device 1210 according to some embodiments of the inventive concept may be used to realize a highly reliable memory card or other memory systems. In particular, the semiconductor memory device according to some embodiments of the inventive concept may constitute a memory system of the latest actively developed solid state drives (SSD).

Figure 31:
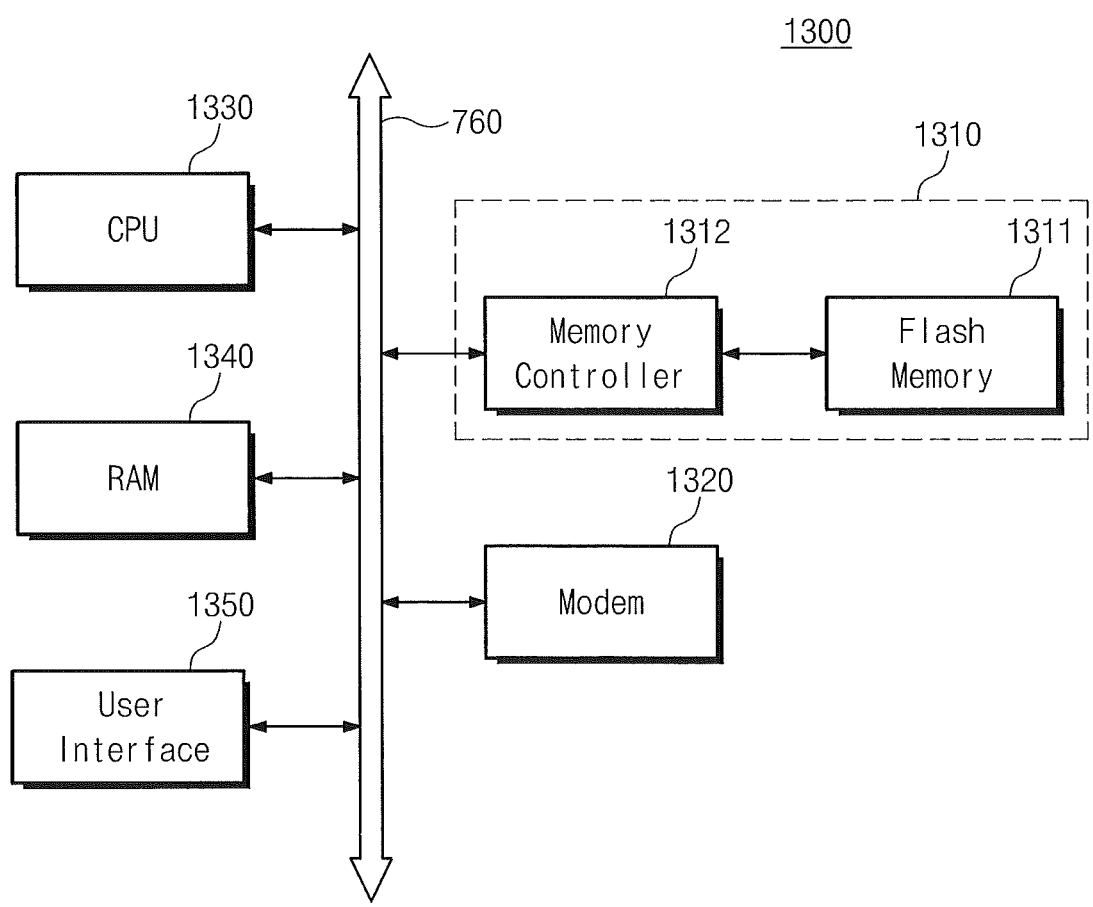
FIG. 31 is a schematic block diagram illustrating an example of information processing systems including semiconductor devices according to some embodiments of the present inventive concept.

FIG. 31 is a schematic block diagram illustrating an example of information processing systems including a semiconductor device according to some embodiments of the inventive concept. As illustrated in FIG. 31, an information processing system 1300 may be realized using a memory system 1310 including at least one of the nonvolatile memory devices according to some embodiments of the inventive concepts. For example, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system 1100 or the memory card 1200. Data processed by the CPU 1330 and/or input from the outside may be stored in the memory system 1310. In some embodiments, the memory system 1310 may be used as a portion of a solid state drive (SSD), and in these embodiments, the information processing system 1300 may stably and reliably store a large amount of data in the memory system 1310. An application chipset, a camera image sensor, a camera image signal processor (ISP), an input/output device, or the like may further be included in the information processing system 1300 according to some embodiments of the present inventive concept.

Furthermore, a nonvolatile memory device according to the inventive concept or a memory system including the same may be packaged in various kinds of ways. For example, the nonvolatile memory device or the memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP). The package in which the semiconductor device according to one of the above embodiments is mounted may further include at least one semiconductor device (e.g., a controller and/or a logic device) that controls the nonvolatile memory device.

According to some embodiments of the inventive concept, by performing two photolithography processes and two spacer processes, patterns can be formed to have a pitch that is smaller than a limitation of photolithography process. In addition, since line and pad portions are simultaneously defined by performing the photolithography process once, there is no necessity to perform an additional photolithography process for forming the pad portion. Accordingly, it is possible to overcome technical problems, such as mask misalignment or bridge.

While some embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming an etch-target layer and a first mask layer on a substrate;
    forming a second mask pattern on the first mask layer, the second mask pattern including a second line portion, a second pad portion, and a second connecting portion between the second line portion and the second pad portion;
    forming a photoresist pattern on the second pad portion;
    forming a first spacer to cover a sidewall of the second mask pattern;
    removing the second line portion and the second connecting portion using the photoresist pattern as an etch mask;
    etching the first mask layer to form a first mask pattern including a first line portion, a first connecting portion, and a first preliminary pad portion, the first line portion, the first connecting portion, and the first preliminary pad portion having shapes corresponding to those of portions of the first spacer covering the second line portion, the second connecting portion, and the second pad portion, respectively, in plan view;
    partially removing end portions of the first line portion and the first preliminary pad portion to form a pair of first pad portions spaced apart from each other;
    forming a second spacer to cover a sidewall of the first mask pattern;
    removing the first line portion and the first connecting portion; and
    etching the etch-target layer using the first pad portion and the second spacer as an etch mask,
    wherein a width of the first spacer is substantially equivalent to a width of the second spacer.

2. The method of claim 1:
    wherein the photoresist pattern comprises a recessed opening overlapped with the second connecting portion; and
    wherein removing the second connecting portion comprises removing the second connecting portion overlapped with the recessed opening.

3. The method of claim 1, wherein removing the second line portion and the second connecting portion comprises removing the second line portion and the second connecting portion using an anisotropic etching process.

4. The method of claim 1, wherein partially removing of the first preliminary pad portion comprises partially removing of the first preliminary pad portion using an isotropic etching process.

5. The method of claim 1, wherein a space between adjacent ones of the second line portions is five times a width of the second spacer.

6. The method of claim 1, further comprising:
    forming a third mask layer on the first mask layer, before the forming of the second mask pattern; and
    etching the third mask layer using the second mask pattern and the first spacer as an etch mask to form a third mask pattern, after the removing of the second line portion and the second connecting portion,
    wherein etching the first mask layer comprises etching the first mask layer using the third mask pattern as an etch mask.

7. The method of claim 6, wherein forming of the second mask pattern comprises:
    forming a second mask layer on the third mask layer;
    forming a fourth mask pattern on the second mask layer, the fourth mask pattern including a fourth line portion, a fourth pad portion, and a fourth connecting portion between the fourth line portion and the fourth pad portion; and
    patterning the second mask layer using the fourth mask pattern as an etch mask to form the second mask pattern,
    wherein, after patterning the second mask layer, the fourth line portion is formed to have a height that is smaller than heights of the fourth pad portion and the fourth connecting portion; and
    wherein, after the forming of the first spacer, the fourth line portion is removed to expose a top surface of the second line portion and the fourth connecting portion such that the fourth pad portion remains on the second connecting portion and the second pad portion.

8. The method of claim 7, wherein the first spacer is formed to cover the second and fourth mask patterns, the method further comprising:
    forming the photoresist pattern on the first spacer covering the second and fourth mask patterns to cover the fourth pad portion and have an opening overlapped with the fourth connecting portion and the fourth line portion; and
    removing the fourth connecting portion and the fourth line portion using the photoresist pattern as an etch mask to expose top surfaces of the second connecting portion and the second line portion.

9. The method of claim 7:
    wherein the first mask layer and the second mask layer comprise a same material;
    wherein the third mask layer and the fourth mask pattern comprise a same material; and
    wherein the first spacer and the second spacer comprise a same material.

10. A method of fabricating a semiconductor device, comprising:
    forming an etch-target layer and a first mask layer on a substrate;

forming a second mask pattern on the first mask layer, the second mask pattern including a second line portion, a second pad portion, and a second connecting portion between the second line portion and the second pad portion;

forming a photoresist pattern on the second pad portion;

forming a first spacer to cover a sidewall of the second mask pattern;

removing the second line portion and the second connecting portion using the photoresist pattern as an etch mask;

etching the first mask layer to form a first mask pattern including a first line portion, a first connecting portion, and a first preliminary pad portion, the first line portion, the first connecting portion, and the first preliminary pad portion having shapes corresponding to those of portions of the first spacer covering the second line portion, the second connecting portion, and the second pad portion, respectively, in plan view;

partially removing end portions of the first line portion and the first preliminary pad portion to form a pair of first pad portions spaced apart from each other;

forming a second spacer to cover a sidewall of the first mask pattern;

removing the first line portion and the first connecting portion; and etching the etch-target layer using the first pad portion and the second spacer as an etch mask, wherein a width of the second line portion is three times a width of the first line portion.

11. A method of fabricating a semiconductor device, comprising:

forming an etch-target layer and a first mask layer on a substrate;

forming a second mask pattern on the first mask layer, the second mask pattern including a second line portion, a second pad portion, and a second connecting portion between the second line portion and the second pad portion;

forming a photoresist pattern on the second pad portion;

forming a first spacer to cover a sidewall of the second mask pattern;

removing the second line portion and the second connecting portion using the photoresist pattern as an etch mask;

etching the first mask layer to form a first mask pattern including a first line portion, a first connecting portion, and a first preliminary pad portion, the first line portion, the first connecting portion, and the first preliminary pad portion having shapes corresponding to shapes of portions of the first spacer covering the second line portion, the second connecting portion, and the second pad portion, respectively, in plan view;

partially removing end portions of the first line portion and the first preliminary pad portion to provide a pair of first pad portions spaced apart from each other;

forming a second spacer to cover a sidewall of the first mask pattern;

removing the first line portion and the first connecting portion; and etching the etch-target layer using the first pad portion and the second spacer as an etch mask, wherein four conductive patterns are formed during etching the etch-target layer, the four conductive patterns including four line portions, respectively; and wherein the four line portions are formed from the second line portion.

12. The method of claim 11:

wherein the four conductive patterns further include four pad portions connected to the four line portions, respectively; and wherein the four conductive patterns are formed from two of the second pad portions.

* * * * *